United States Patent [19]

Nishiwaki et al.

[11] Patent Number: 5,684,900
[45] Date of Patent: Nov. 4, 1997

[54] WAVELENGTH LOCKING DEVICE, BEAM COLLIMATING DEVICE, AND OPTICAL DISK APPARATUS

[75] Inventors: Seiji Nishiwaki; Junichi Asada, both of Osaka, Japan

[73] Assignee: Matsushita Electric Industrial Co., Ltd., Osaka, Japan

[21] Appl. No.: 550,634

[22] Filed: Oct. 31, 1995

[30] Foreign Application Priority Data

Oct. 31, 1994 [JP] Japan .................................. 6-267172

[51] Int. Cl.$^6$ .................................................. G02B 6/26
[52] U.S. Cl. .................. 385/31; 385/33; 385/37; 385/29; 369/109; 369/44.12
[58] Field of Search ........................ 385/31, 14, 37, 385/29, 33, 28, 32, 34, 35, 36, 38; 369/109, 112, 44.12, 110, 111

[56] References Cited

U.S. PATENT DOCUMENTS 5,159,650  10/1992  Nishiwaki et al. ....................... 385/37
5,495,462  2/1996  Nishiwaki et al. ....................... 385/37 X

OTHER PUBLICATIONS

"External cavity semiconductor laser with a Fourier grating and an aspheric lens", Hiroyuki Asakura et al., Applied Optics, vol. 32, No. 12, 20 Apr. 1993, pp. 2031–2038.

*Primary Examiner*—Phan T. H. Palmer

[57] ABSTRACT

A waveguide layer is formed on a transparent substrate disposed to cross an optical axis perpendicularly, and on the waveguide layer, a concentric circular grating coupler is disposed so that the optical axis passes the center. A light beam radiated from a semiconductor laser passes through the transparent substrate and enters the waveguide layer. Light beams enter the respective positions of the grating coupler are excited and move from the periphery to the center, and the light beams pass through the center and become waveguide light beams. The waveguide light beam is the reverse wave of the waveguide light beam inputted at the transmittance position. Therefore, the radiant beam radiated from the grating coupler also becomes a reverse wave inputted at the irradiating position, and is accurately fed back to the semiconductor laser. The laser wavelength is locked since the radiant beam has wavelength selectivity.

20 Claims, 15 Drawing Sheets

WAVELENGTH LOCKING DEVICE, BEAM COLLIMATING DEVICE, AND OPTICAL DISK APPARATUS

FIELD OF THE INVENTION

The present invention relates to a wavelength locking device which locks the wavelength of output light beams from a semiconductor laser, a beam collimating device which comprises the wavelength locking device, and further relates to an optical disk apparatus which reproduces signals of an optical disk by using the devices.

BACKGROUND OF THE INVENTION

FIG. 20 is a sectional view showing an example of wavelength locking devices with conventional diffraction grating which are described in National Convention of Light Beam and Radio Wave Section by IECE (Institute of Electronics and Communication Engineers of Japan) vol.2, 194, p.23 (1986), and Applied Optics Vol.32, No.12, p.2031–p.2038 (1993), and other documents. In FIG. 20, a light beam 6 radiated from a semiconductor laser 1 becomes a parallel beam 7 through a collimator lens 2 having focal length f, and enters a diffraction grating 24. The grating of the diffraction grating 24 is arranged in a direction perpendicular to the surface of the paper sheet. When a grating pitch of the diffraction grating is $\Lambda$ and the angle formed by a normal line 25 of the diffraction grating surface and an optical axis 10 is $\theta$, the light beam having a wavelength given in the following formula is reflected by the diffraction grating, diffracted and fed back toward the light source (semiconductor laser 1).

$$\lambda = 2\Lambda\sin\theta$$

Anti-reflection coating (hereinafter abbreviated as AR-coating) is provided on an output face 1a of the semiconductor laser 1 so that the feedback light from the diffraction grating 24 can enter easily. When a light beam is not fed back, the wavelength (the standard wavelength) of the semiconductor laser 1 is denoted to be $\lambda_o$. Then the wavelength of the semiconductor laser 1 is locked to $\lambda$ by the feedback light, when $\lambda$ and $\lambda_o$ are within the scope of the following formula.

$$|\lambda - \lambda_o| < 10\text{–}50 \text{ nm}$$

As a result, the wavelength of another light beam 26 radiated from the other end face 1b of the semiconductor laser 1 is also locked.

In this formula, the value of the right side becomes higher when the index of reflection of the end face 1a is lower, or when the distance between the light source (the semiconductor laser 1) and the diffraction grating 24 is shorter. If a light beam having wavelength $\lambda$ is accurately fed back to the end face 1a, a light beam having wavelength $\lambda + \Delta$ is fed back as shown by the broken line 6S in FIG. 20 since the diffraction angle at the diffraction grating 24 changes. Therefore, the focusing point will be tilted from the end face 1a. The locking strength of the wavelength of the semiconductor laser 1 to $\lambda$ is in proportion to the feedback efficiency to the end face 1a (i.e., the ratio of the feedback light quantity to the quantity of output light), and the resolution in the wavelength selectivity can be expressed with the value of $\Delta$ at which the quantity of the feedback light is half of the optimum condition. The resolution of conventional wavelength locking device can be approximately shown by the following formula.

$$\Delta = \lambda^2 / 1.2 f \tan\theta$$

As is clear from this formula, the focal length f of collimator lens 2 should be longer in order to raise the resolution, i.e., to minimize the value of $\Delta$. For example, a collimator lens with f=6 mm or more is used to obtain resolution of 0.2 nm or less.

In the above-mentioned conventional wavelength, the collimator lens 2 and the semiconductor laser 1 should be adjusted with high accuracy to the rotational directions of three dimensions or two dimensions. For, example, the diffraction grating 24 should be perpendicular to the surface of the paper sheet. Furthermore, the angle $\theta$ between the normal line 25 of the grating face of the diffraction grating 24 and the optical axis 10 should be adjusted accurately so that the requirement indicated by the following formulas will be fulfilled.

$$\lambda = 2\Lambda\sin\theta$$

$$|\lambda - \lambda_o| < 10\text{–}50 \text{ nm}$$

However, such an adjustment is not easy. In addition, a collimator lens with larger focal length f should be used in order to raise the resolution in the wavelength selectivity. Therefore, it has been difficult to miniaturize the apparatus.

SUMMARY OF THE INVENTION

Considering the above-mentioned disadvantages of conventional techniques, it is the objective of the present invention to provide a wavelength locking device which can be adjusted easily and can be miniaturized while keeping a high resolution in wavelength selectivity. It is another objective of the present invention to provide a beam collimating device and an optical disk apparatus which use the wavelength locking device and have a good beam collimating property.

In order to accomplish these objectives, this invention includes a laser light source, a transparent substrate which is provided so as to cross an optical axis of the laser beam radiated from the laser light source perpendicularly, a waveguide layer with an equivalent refractive index N which is formed on the transparent substrate, a light-coupling medium having a periodic structure of a concentric circle with a pitch $\Lambda$ surrounding the optical axis, for example, a grating coupler. By means of the light-coupling medium, the laser beam excites a waveguide light beam moving from the center to the periphery and from the periphery to the center of the periodic structure in the waveguide layer. And the waveguide light beam is radiated partially to be crossed the incident surface of the waveguide layer at about a right angle, and then the radiant beam is fed back to the laser light source. Therefore, the size of the wavelength $\lambda$ of the laser beam can be locked to $N\Lambda$. In addition, it is enough that the position of the waveguide locking device is adjusted in the face which is perpendicular to the optical axis of the center of the light-coupling element. As a result, the adjustment will be simpler compared with the conventional techniques.

It is also possible to input the laser beam to the incident surface of the waveguide layer at about a right angle by arranging a beam collimating medium like a collimator lens between the laser light source and the waveguide layer in order to collimate the laser beam and make it parallel.

And another embodiment of a wavelength locking device of this invention includes a laser light source, a transparent substrate which is provided so as to cross an optical axis of the laser beam radiated from the laser light source perpendicularly, a waveguide layer which is formed on the transparent substrate, a light-coupling medium which is formed on either upper surface or lower surface of the waveguide layer and has a periodic structure of a concentric circle surrounding the optical axis. By means of the light-coupling medium, the laser beam excites a waveguide light beam moving from the periphery to the center of the periodic structure within the waveguide layer, and the waveguide light beam passing through the center is radiated from the light-coupling medium, and then the radiant beam is fed back to the laser light source. Therefore, the wavelength of the laser beam can be locked and the collimating medium like a collimator lens can be omitted. As a result, the structure will be simplified.

When the equivalent refractive index of the waveguide layer is $N_o$, the pitch of the light-coupling medium is $\Lambda$, the incident angle of the laser beam to the light-coupling medium is $\theta$, and the refractive index of the transparent substrate is n, the coupling efficiency to the waveguide layer is raised by fulfilling the condition of the formula $$\Lambda = \lambda/(N_o + n \cdot \sin\theta)$$

And the feedback efficiency of the light radiated from the light-coupling medium to the laser light source can also be raised. In addition, the radiant beam radiated from the light-coupling medium has wavelength selectivity, so that the wavelength of the laser light source is locked to $\lambda$ when the wavelength $\lambda$ shown in the above formula and the standard wavelength $\lambda_o$ of the laser light source are within the scope of the formula $$|\lambda - \lambda_o| < 10\text{--}50 \text{ nm}.$$

And according to another embodiment of this invention, the light-coupling medium is divided into the peripheral coupling portion and inside coupling portion by bordering radius $r_o$ from the optical axis. And in the peripheral coupling portion, the light-coupling medium excites the waveguide light beam which moves from the periphery to the center while in the inside coupling portion it excites the waveguide light beam which moves from the center to the periphery. Thus, the waveguide light beam, which is inputted into the peripheral coupling portion and moves from the periphery to the center, crosses the boundary of the radius $r_o$ and is radiated from the inside coupling portion. Therefore, the radiant beam can be fed back to the laser light source and the wavelength of the laser beam can be locked.

For example, in the following formula, $\Lambda$ is a pitch of the periodic structure of the light-coupling medium at a point of the radius r from the optical axis. If the pitch $\Lambda$ meets the requirement of the following formula, the radiant beam can be the reverse wave of the inputted light beam when the waveguide light which moves from the periphery to the center crosses the boundary of the radius $r_o$ and is radiated from the inside coupling portion.

$$\Lambda = \lambda/(N_o - n \cdot \sin\theta),$$

when $r \leq r_o$ and $$\Lambda = \lambda/(N_o + n \cdot \sin\theta),$$

when $r > r_o$

Therefore, it is possible to feed the radiant beam accurately back to the laser light source. Also by satisfying the requirement of the above formula, the light beam radiated from the light-coupling medium has wavelength selectivity.

As a result, the wavelength of the laser light source is locked to $\lambda$ when the wavelength $\lambda$ and the standard wavelength $\lambda_o$ of the laser light source are within the scope of the following formula.

$$|\lambda - \lambda_o| < 10\text{--}50 \text{ nm}$$

Or the equivalent refractive index of the annular region from $r_o$ to $r_1$ (radius from the optical axis) is different from the other regions of the light-coupling medium, the waveguide light beam which moves from the center to the periphery is excited inside of the annular coupling portion. And in the annular coupling portion, the waveguide light beam which moves from the periphery of the periodic structure to the center is excited, and the waveguide light beam which moves from the periphery to the center is radiated from the region inside of the annular coupling portion. Therefore, the radiant beam can be fed back to the laser light source and the wavelength of the laser beam can be locked.

For example, in the following formula, $\theta_o$ and $\theta_1$ are respectively the incident angles of the waveguide light beam to the light-coupling medium when the radii are $(r_o+r_1)/2$ and r. $\Lambda$ is the pitch of the periodic structure of the light-coupling medium, N is the equivalent refractive rate of the waveguide layer at a point of radius r, n is the refractive index of the transparent substrate. When the requirement of the following formula is fulfilled, the waveguide light beam moving from the periphery to the center is excited at the site of radius $(r_o+r_1)/2$, and the phase matching condition does not differ so much even the radius is $r_o < r < r_1$.

$$\Lambda = \lambda/(N_o - n \cdot \sin\theta)$$

As a whole, the waveguide light beam moving from the periphery to the center can be excited. When the waveguide light beam passes the radius $r_o$ and reaches the inside and then is radiated from the inside light-coupling medium, the radiant beam becomes the reverse light beam to the inputted light at the irradiated point, thus the radiant beam can be fed back to the laser light source. And by fulfilling the requirement of the above formula, the radiant beam fed back from the light-coupling medium has wavelength selectivity. When the wavelength $\lambda$ shown in the above formula and the standard wavelength $\lambda_o$ of the semiconductor laser 1 are within the scope presented by the formula ($|\lambda - \lambda_o| < 10\text{--}50$ nm), the wavelength of the laser beam source is locked to $\lambda$.

And the equivalent refractive index of the annular region with radius ($r_o$ to $r_1$) can be easily changed by making this region thinner than other regions by etching or by other way.

A third embodiment of the wavelength locking device of this invention includes a laser light source, a transparent substrate which is provided so as to cross an optical axis of the laser beam radiated from the laser light source perpendicularly, a waveguide layer formed on the transparent substrate, a first light-coupling medium which is formed either on the upper side or on the lower side of the waveguide layer and has a concentric circular periodic structure surrounding an optical axis, and a second light-coupling medium which has a concentric circular periodic structure surrounding an optical axis and formed in the region around the first light-coupling medium either on the upper or lower side of the waveguide layer by means of the first light-coupling medium, the laser beam excites a waveguide light beam moving from the center to the periphery of the periodic structure. The first waveguide light beam is radiated by the light-coupling medium and collimated on the reflecting surface. The light beam reflected by the reflecting surface moves from the periphery of the periodic structure to the center and excites the second waveguide light beam by means of the second light-coupling medium. And the second waveguide light beam is radiated from the first light-coupling medium so that the radiant beam can be fed back to the laser light source. Therefore, it is possible to lock the wavelength of the laser beam.

In the embodiment, the equivalent refractive index is denoted $N_o$, the pitch of the first light-coupling medium is $\Lambda_o$, the pitch of the second light-coupling medium is $\Lambda_1$, the incident angle of the laser beam to the first light-coupling medium is $\theta_o$, the outgoing angle of the laser beam to the second light-coupling medium is $\theta_1$, and the index of refraction of the transparent substrate is n. If the pitches $\Lambda_o$ and $\Lambda_1$ of the periodic structure of the first and second light-coupling media meet the requirement of the following formula, light beams which enter the respective positions of the first light-coupling medium are excited to be the waveguide light beams which move from the center to the peripheral area.

$$\Lambda_o = \lambda/(N_o - n \cdot \sin\theta_o)$$

$$\Lambda_1 = \lambda/(N_o + n \cdot \sin\theta_1)$$

The waveguide light beam moves to the periphery and is radiated from the second light-coupling medium, and becomes a radiant beam having convergence, and is collimated on a collimating point on the reflecting surface provided so as to cross the optical axis perpendicularly. The light beam reflected by the reflecting surface enters the second light-coupling medium and is excited as indicated in the above formula, to be the waveguide light beam moving from the periphery to the center. The feedback waveguide light beam which reaches the first light-coupling medium is the reverse wave of the inputted waveguide light beam at the position. Therefore, when the waveguide light beam is radiated from the first light-coupling medium, the radiant beam also becomes a reverse light beam of the inputted light beam on the irradiation position, so that the radiant beam can be accurately fed back to the laser light source. The radiant beam moving toward the laser light source has wavelength selectivity shown in the above formula, since it is a feedback light beam through input-and-output of light beam in the first and second light-coupling media. As a result, the wavelength of the laser light source is locked to $\lambda$ when the wavelength $\lambda$ shown in the above formula and the standard wavelength $\lambda_o$ of the laser light source are within the scope of the formula ($|\lambda - \lambda_o| < 10-50$ nm), since the radiant beam is fed back to the output end face of the laser light source.

And between the first and second light-coupling media, the transparent substrate is provided with an offset structure. Due to the offset structure, the waveguide layer is bent to form an offset part. Thus the waveguide light beam passes through the offset part and changes the waveguide mode. Therefore, components with unchanged waveguide mode are fed back to the laser light source to lock the wavelength of the laser light beam while the other components with changed waveguide mode can be used for other purposes like scanning of optical disk signal.

When $N_o$ and $N_1$ are respectively the equivalent refractive indexes to the waveguide light beam before and after passing through the offset part, $\theta_o$ is the incident angle of the laser beam to the first light-coupling medium, $\theta_1$ is the radiant angle of the outgoing radiant beam from the second light-coupling medium, n is the refractive index of the transparent substrate, and when the pitches $\Lambda_o$ and $\Lambda_1$ of the first and second light-coupling media meet the requirement of the following formula, the components with unchanged waveguide mode can be accurately fed back to the laser light source.

$$\Lambda_o = \lambda/(N_o - n \cdot \sin\theta_o)$$

$$\Lambda_1 = \lambda/(N_o + n \cdot \sin\theta_1)$$

A beam collimating device of this invention includes a laser light source, a transparent substrate which is provided to cross an optical axis of the laser beam radiated from the laser light source perpendicularly, a waveguide layer provided on the transparent substrate, a first light-coupling medium which is formed on the upper or lower side of the waveguide layer and has a periodic structure of concentric circle surrounding the optical axis, and a second light-coupling medium which has periodic structure of concentric circle around the first light-coupling medium on the upper or lower side of the waveguide layer. By means of the first light-coupling medium, the laser beam excites a waveguide light beam which moves from the center to the periphery and from the periphery to the center of the periodic structure within the waveguide layer. The waveguide light beam is radiated from the second light-coupling medium and collimated on a predetermined collimating point. The light beam reflected by the reflecting surface provided near the collimating point becomes the second waveguide light beam which moves from the periphery to the center by the second light-coupling medium, and the second waveguide light beam is excited from the radiant beam by the first light-coupling medium in order to feed back the radiant beam to the laser light source, thus the wavelength of the laser beam can be locked.

Since the periodic pitches $\Lambda_o$ and $\Lambda_1$ of the first and second light-coupling media meet the requirement of the formula $$\Lambda_o = \lambda/(N_o - n \cdot \sin\theta_o)$$

$$\Lambda_1 = \lambda/(N_o + n \cdot \sin\theta_1),$$

the light beams enter the respective positions of the first light-coupling medium are excited to be the waveguide light beams moving from the center to the periphery, become a collimated radiant beam radiated by the second light-coupling medium, and be collimated at the collimating point on the reflecting surface provided so as to cross the optical axis perpendicularly.

And between the first and second light-coupling media, the transparent substrate is provided with an offset structure. Due to the offset structure, the waveguide layer is bent to form an offset part. Thus the waveguide light beam passes through the offset part and changes the waveguide mode. Therefore, components with unchanged waveguide mode are fed back to the laser light source in order to lock the wavelength of laser light source while the other components with changed waveguide mode can be used for other way like scanning optical disk signal.

When $N_o$ and $N_1$ are respectively the equivalent refractive indexes to the waveguide light beam before and after passing through the offset part, $\theta_o$ is the incident angle of the laser beam to the first light-coupling medium, $\theta_1$ the radiant angle of the outgoing radiant beam from the second light-coupling medium, n is the refractive index, and when the pitches $\Lambda_o$ and $\Lambda_1$ of the first and second light-coupling media meet the requirement of the formula $$\Lambda_o = \lambda/(N_o - n \cdot \sin\theta_o)$$

and $\Lambda_1 = \lambda/(N_o + n \cdot \sin\theta_1)$, the components with unchanged waveguide mode can be accurately fed back to the laser light source.

An optical disk apparatus of the present invention includes a laser light source, a transparent substrate which is provided to cross the optical axis of the laser beam radiated from the laser light source perpendicularly, a waveguide layer provided on the transparent substrate, a first light-coupling medium which is formed on the upper or lower side of the waveguide layer and has a periodic structure of concentric circle surrounding the optical axis, and a second light-coupling medium which has a periodic structure of concentric circle around the first light collimating medium on the upper or lower side of the waveguide layer. Between the first and second light-coupling media the transparent substrate has an offset structure and the waveguide layer is bent by the offset structure to form a offset part. As a result, by means of a first light-coupling medium, a laser light beam excites a first waveguide light beam moving from the center to the periphery of the periodic structure. The first waveguide light beam is radiated from the second light-coupling medium and collimated on the reflecting surface of the optical disk, and the light beam reflected by the reflecting surface excites the second waveguide light beam which moves from the periphery to the center by means of the second light-coupling medium. The first and the second waveguide light beams is converted to the waveguide light beams with different waveguide modes when the first and the second waveguide light beams pass through the offset parts. And a part of the first waveguide light beam which has the different waveguide mode is radiated by the first light-coupling medium and the first radiant beam is fed back to the laser light source. Therefore, the wavelength of the laser beam can be locked. Also, a part of the second waveguide light beam with a different waveguide mode is radiated by the first light-coupling medium to be an angle different from the laser light source, and the second radiant beam is detected by an optical detector disposed in the direction of the radiation. And the signal of the reflecting surface can be reproduced by the signals of the optical detector.

In addition, a third light-coupling medium is formed in plural hollow sector regions adjacent to the periphery of the second light-coupling medium and provided with a concentric circular periodic structure surrounding the optical axis. Therefore, a part of the first waveguide light beam moving from the center to the periphery is radiated from the third light-coupling medium and collimated on the front and the back of the reflecting surface. The light beam reflected by the reflecting surface is excited by the third light-coupling medium and becomes the third waveguide light beam which moves from the periphery of the periodic structure to the center and then passes through the offset part. Due to this, the third waveguide light beam with changed waveguide mode is radiated by the first light-coupling medium in a direction different from the laser light source, and the third radiant beam is detected by plural optical detectors disposed in the direction being along with the radiating direction and also corresponding to the third light coupling medium. Since these detecting signals include signal information of the reflecting surface, a focusing error signals can be obtained from the difference circuit of the optical detector.

And by forming pit marks or dot marks on the reflecting surface, the quantity of light which is fed back to the laser light source changes. As a result, the oscillating quantity of light of the laser light source is also changes. Therefore the marks on the reflecting surface can be read in accordance with the change of the quantity of the oscillating of light.

As mentioned above, this invention can provide with a wavelength locking device which is easily adjusted and has a simple structure. And the size of the device according to this invention can be miniaturized compared to the conventional ones, namely the ratio is 1:5–6, while keeping high resolution in wavelength selectivity. Furthermore, the wavelength locking device prevents the generation of mode hopping of the light source, thus the collimating position does not change. As a result, this invention can provide with a beam collimating device in which the collimating position does not change even if the wavelength generated between the reproducing mode and the recording mode of the laser changes. Therefore it does not need a high frequency superposed circuit which has been adapted for a conventional optical head, and also lowers the cost for the optical head. Moreover, it is possible to cancel the effect of the aberration caused by the error of the equivalent refraction index of the wavelength layer, and the limitation relating to the aperture is substantially eased. And if signals are reproduced utilizing the change of the quantity of feedback light to the semiconductor laser, the signals can be reproduced with lower noise, since the wavelength of the feedback light beam can be selected.

DETAILED DESCRIPTION OF THE INVENTION

EXAMPLE 1

Figure 1:
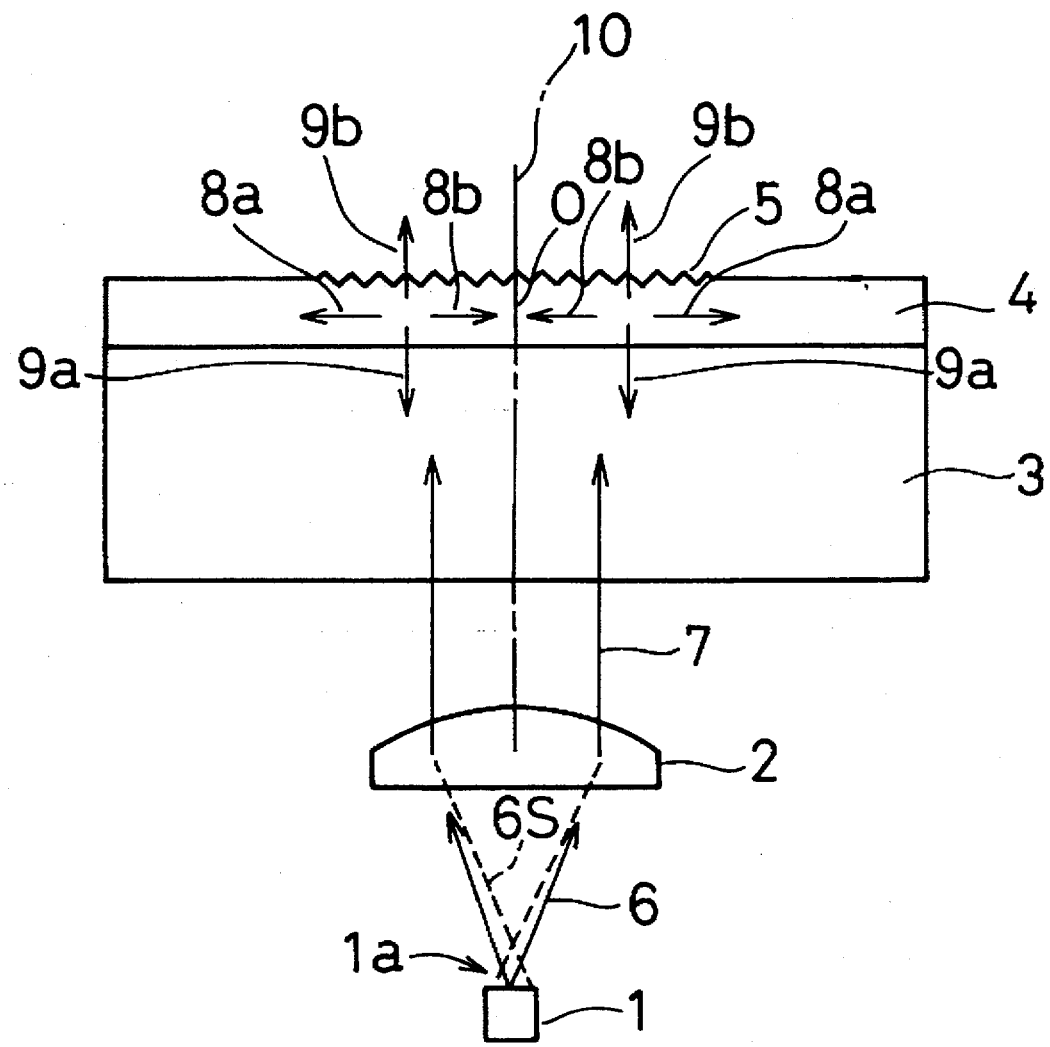
FIG. 1 is a cross-sectional view showing the structure of a wavelength locking device according to Example 1 of the present invention.

Example 1 is related to a wavelength locking device of this invention, and is described referring to FIG. 1 is a cross-sectional view showing to a wavelength locking device according to Example 1. In FIG. 1, a waveguide layer 4 is formed on a transparent substrate 3 which is composed of materials like quartz. The waveguide layer 4 is a film comprising e.g. SiN, SiON or $Ta_2O_5$, comprising a mixed material of $Ta_2O_5$ and $SiO_2$, or a laminated layer of these films. A concentric circular grating 5 (pitch $\Lambda_o$) is formed on the waveguide layer 4. The grating 5 which has a point O as its center functions as a coupler (hereinafter, grating coupler 5). A light beam 6 radiated from a semiconductor laser 1 becomes a parallel light 7 through a collimator lens 2 with focal length f, passes through a transparent substrate 3 which is provided to cross perpendicularly an optical axis 10, and enters a waveguide layer 4 at a right angle. The semiconductor laser 1 is disposed so that the optical axis 10 passes through the center O of the grating coupler 5. The light beams which enter the respective positions of the grating coupler 5 excite waveguide light beams 8a and 8b simultaneously. The waveguide light beam 8a moves from the center O to the periphery, and 8b moves from the periphery to the center O. These waveguide light beams 8a and 8b excite light beams 9a and 9b which are radiated in the direction to cross perpendicularly the waveguide layer 4. The radiant beam 9a is fed back to the semiconductor laser 1 through the collimator lens 2. When the equivalent refractive index of the waveguide layer is $N_o$, the condition in which the grating coupler 5 excites the waveguide light beam, namely the radiant beam 9a is fed back to the semiconductor laser 1 is presented by the following formula.

$$\lambda = N_o \Lambda_o$$

It is clear from this formula that the radiant beam 9a which is fed back to the semiconductor laser 1 (i.e., a feedback light beam) has wavelength selectivity. The feedback light beam which exceeds the predetermined level of light quantity locks the wavelength of the laser beam. It occurs in general when the quantity of feedback light is about 10% of the amount of the radiated light when the semiconductor laser 1 has 30% of reflection coefficient. In other words, if the wavelength $\lambda$ shown in the above formula and the standard wavelength $\lambda_o$ of the semiconductor laser 1 are within the scope shown in the following formula, $$|\lambda - \lambda_o| < 10 - 50 \text{ nm},$$

the wavelength of the semiconductor laser 1 is locked to $\lambda$.

In another case, a light beam with wavelength $\lambda$ is radiated from the semiconductor laser 1, inputted and outputted at the grating coupler 5, and fed back with accuracy to an output end face 1a of the semiconductor laser 1. Since a part of the light radiated from the semiconductor laser 1, for example a light beam with wavelength of $\lambda + \Delta$, does not agree on the optimum input condition ($\lambda = N_o \Lambda_o$) at the grating coupler 5, the input efficiency will be deteriorated. Moreover, since the output direction of the outputted light beam from the grating coupler 5 (radiant beam 9a) is inclined to the normal line of the waveguide layer 4, the collimating point deviates from the end face 1a to the optical axis direction (see the broken line 6S of FIG. 1). The resolution of the wavelength locking device in the wavelength selectivity is determined by the synergistic action, and the resolution in Example 1 can be approximately presented by the following formula.

$$\Delta = 4.7 \lambda^2 / f$$

The collimator lens 2 is adjusted to the rotating direction of three dimension and two dimensions to the laser light source 1. However, it will be enough that the position of the wavelength locking element is adjusted in the surface perpendicular to the optical axis 10 with the center O of the grating coupler 5, since the optical axis 10 is perpendicular to the wavelength locking element (an element on the transparent substrate 3 including the waveguide layer 4 and the grating coupler 5). Therefore, this embodiment has an advantage compared to the conventional technique in that it requires much easier adjustment. Similar advantage will be obtained if the grating of the grating coupler 5 is formed under the waveguide layer 4, namely on the transparent substrate 3. AR-coating will be also effective in order that the feedback light beam is easily inputted to the output end face 1a of the semiconductor laser 1.

EXAMPLE 2

Figure 2:
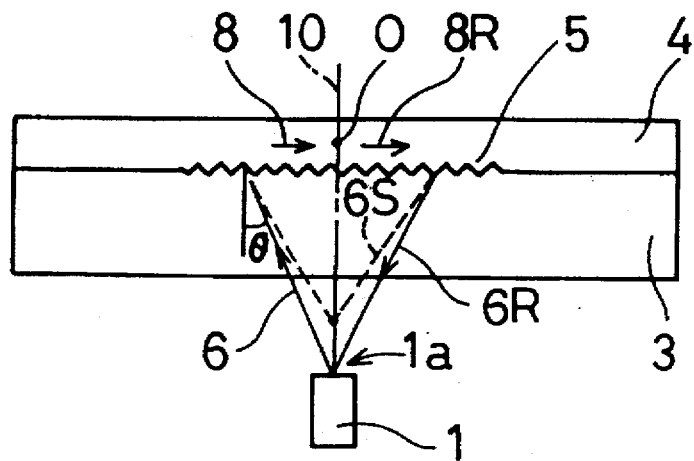
FIG. 2 is a cross-sectional view showing the structure of a wavelength locking device according to Example 2 of the present invention.
Figure 3:
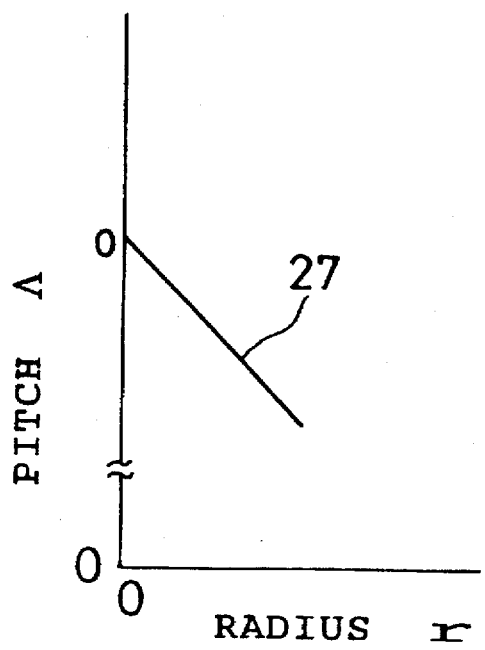
FIG. 3 is a diagram illustrating the relation between the grating pitch and the radius according to Example 2.

Example 2 relates to a wavelength locking divide according to the present invention, and can be explained referring to FIGS. 2 and 3. The structures common to those of Example 1 are indicated with the same number. FIG. 2 is a cross-sectional view showing the structure of the wavelength locking device according to Example 2, and FIG. 3 is a diagram illustrating the relation between the grating pitch and the radius r according to Example 2. In FIG. 2, a concentric circular grating coupler 5 having O at the center is formed on a transparent substrate 3 comprising quartz etc., and a waveguide layer 4 is also formed thereon. The waveguide layer is a film comprising e.g. SiN, SiON or $Ta_2O_5$, or comprising a mixed material of $Ta_2O_5$ and $SiO_2$, or a laminated layer of these films. The light beam 6 radiated from a semiconductor laser 1 passes through a transparent substrate 3 provided to cross perpendicularly an optical axis 10, and enters a waveguide layer 4. The semiconductor laser 1 is disposed so that the optical axis 10 passes through the center O of the grating coupler 5. The light beams which enter the respective positions of the grating coupler 5 excites a waveguide light beam 8. The waveguide light beam 8 passes through the center O and becomes a waveguide light beam 8R. Since the waveguide light beam 8R is the reverse light to the inputted waveguide light beam at the transmission position, a radiant beam 6R also becomes a reverse light beam to the inputted light beam at the radiating point when the waveguide light beam 8R is radiated from the grating coupler 5. In other words, radiant beam 6R is accurately fed back to the semiconductor laser 1. When the equivalent refractive index of the waveguide layer 4 is $N_o$, the condition in which the grating coupler 5 excites the waveguide light beam, namely the radiant beam 6R is fed back to the semiconductor laser 1, is presented by the following formula.

$$\Lambda=\lambda/(N_o+n\cdot\sin\theta)$$

in this formula, n is the refractive index of the transparent substrate 3, θ is the incident angle to the grating coupler 5, Λ is the grating pitch at this incident position. In FIG. 3, the characteristic curve 27 indicates the relations between the grating pitch Λ and radius r (the relation between r and θ is determined geometrically) and $\Lambda_o$ is the grating pitch at the center O.

It is clear from the above formula that the radiant beam 6R which is fed back from the grating coupler 5 has wavelength selectivity. After the radiant beam 6R is fed back to the laser end face 1a, the wavelength of the laser is locked. In other words, if the wavelength λ shown in this formula and the standard wavelength $\lambda_o$ of the semiconductor laser 1 are within the scope shown in the following formula.

$$|\lambda-\lambda_o|<10-50 \text{ nm},$$

the wavelength of the semiconductor laser 1 is locked to λ.

In another case similar to that of Example 1, a light beam with wavelength λ is radiated from the semiconductor laser 1, inputted and outputted at the grating coupler 5, and fed back with accuracy to an output end face 1a of the semiconductor laser 1. Since a part of the light radiated from the semiconductor laser 1, for example a light beam with wavelength of λ+Δ, does not agree on the optimum input condition ($\Lambda=\lambda/(N_o+n\cdot\sin\theta)$), the input efficiency will be deteriorated. Moreover, the radiant beam 6R deviates from the reverse direction of the inputted light beam at the irradiation position and is fed back as shown by the broken line 6S of FIG. 2. As a result, the collimating point is inclined from the end face 1a of the semiconductor laser 1 to the optical axis. The resolution of the wavelength locking device in the wavelength selectivity is determined by the synergistic action, and the resolution in Example 2 can be approximately presented by the following formula.

$$\Delta=(0.6-1.2)\cdot\lambda^2/f$$

In this formula, f is a focal length of the grating coupler 5. Namely, the value of f is obtained by substracting the thickness of the transparent substrate 3 from the distance between the semiconductor laser 1 as the light source and the grating coupler 5, and dividing the figure by the refractive index of the transparent substrate 3. The value of the coefficient (0.6–1.2) becomes smaller as the spreading angle of the laser beam is bigger (the value of 0.6 corresponds to the spreading angle of 35°).

In Example 2, the optical axis 10 is perpendicular to the wavelength locking element (an element on the transparent substrate 3 including the grating coupler 5 and the waveguide layer 4). Therefore, the adjustment can be substantially simplified compared to the conventional technique: first, the distance from the light source (semiconductor laser) 1 should be adjusted, and the position of the center O of the grating coupler 5 needs to be adjusted in the face perpendicular to the optical axis 10. The structure according to Example 2 can be further simplified since a collimator lens 2 is not necessary unlike the conventional technique or Example 1. Moreover, resolution with 0.2 nm or less can be obtained at the focal length of f=2–4 mm. Therefore, the size of the apparatus can be miniaturized to one-fifth or one-sixth of those of the conventional techniques while keeping high resolution. Similar effect can be obtained if the grating of the grating coupler 5 is formed on the waveguide layer 4. AR-coating will be also effective in order that the feedback light beam is easily inputted to the output end face 1a of the semiconductor laser 1.

EXAMPLE 3

Figure 4:
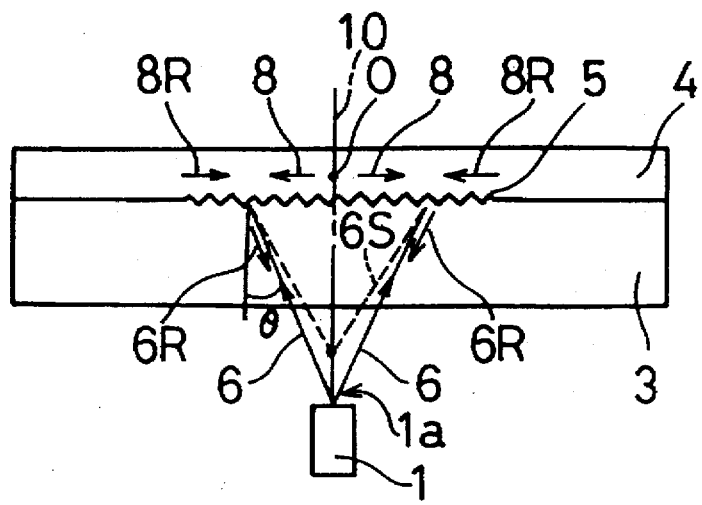
FIG. 4 is a cross-sectional view showing the structure of a wavelength locking device according to Example 3 of the present invention.
Figure 5:
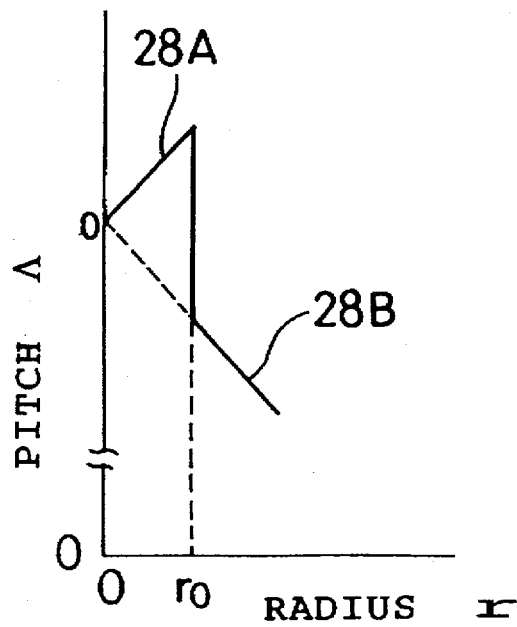
FIG. 5 is a diagram illustrating the relation between the grating pitch and the radius according to Example 3.

Example 3 relates to a wavelength locking device of the present invention, and can be explained referring to FIGS. 4 and 5. The structures common to those of Example 2 are indicated with the same number and the explanation will be omitted. FIG. 4 is a cross-sectional view showing the structure of the wavelength locking device according to Example 3, which is similar to that of Example 2 except the specification of pitches. FIG. 5 is a diagram illustrating the relations between the grating pitch Λ and the radius r of Example 3. In FIG. 4, the light beams which enter the respective positions of the grating coupler 5 excites a waveguide light beam 8 inside of the radius $r_o$ and to be the waveguide light beam 8R outside of the radius $r_o$. The waveguide light beam 8 moves from the center to the periphery while the waveguide light beam 8R moves from the periphery to the center O. When the equivalent refractive index is $N_o$, the condition in which the grating coupler 5 excites the waveguide light beams 8 and 8R is expressed by the following formula.

$$\Lambda=\lambda/(N_o-n\cdot\sin\theta),$$

when $r\leq r_o$ $$\Lambda=\lambda/(N_o+n\cdot\sin\theta),$$

when $r>r_o$

In this formula, n is the refractive index of the transparent substrate 3, θ is the incident angle to the grating coupler 5, Λ is the grating pitch at this incident position. In FIG. 5, the characteristic curves 28A and 28B indicate the relations between the grating pitch Λ and radius r, and $\Lambda_o$ is the grating pitch at the center O. When the waveguide light beam 8R passes through the radius $r_o$ and reaches the inside to be radiated from the grating coupler 5, the radiant beam 6R becomes the reverse wave of the inputted light beam at the irradiation position. In other words, the radiant beam 6R is fed back with accuracy to the semiconductor laser 1. It is clear from this formula that the radiant beam 6R which is fed back from the grating coupler 5 has wavelength selectivity. Since the radiant beam 6R is fed back to the laser end face 1a of the semiconductor laser 1, the wavelength of the laser is locked. In other words, if the wavelength λ shown in the above formula and the standard wavelength λ of the semiconductor laser 1 are within the scope shown in the following formula, $$|\lambda-\lambda_o|<10-50 \text{ nm},$$

the wavelength of the semiconductor laser 1 is locked to λ.

In another case like Examples 1 and 2, a light beam with wavelength λ is radiated from the semiconductor laser 1, inputted and outputted at the grating coupler 5, and fed back with accuracy to an output end face 1a of the semiconductor laser 1. Since a part of the light radiated from the semiconductor laser 1, for example a light beam with wavelength of λ−Δ, does not agree on the optimum input condition, namely $$\Lambda = \lambda/(N_o - n \cdot \sin\theta),$$

when $r \leq r_o$ $$\Lambda = \lambda/(N_o + n \cdot \sin\theta),$$

when $r > r_o$,
the input efficiency will be deteriorated. Moreover, the radiant beam 6R deviates from the reverse direction of the inputted light beam at the irradiation position and is fed back as shown by the broken line 6S of FIG. 4. As a result, the collimating point is inclined from the end face 1a of the semiconductor laser 1 to the optical axis. The resolution of the wavelength locking device in the wavelength selectivity is determined by the synergistic action, and the resolution in Example 3 can be approximately presented like Example 2 with the formula.

$$\Delta = (0.6-1.2) \cdot \lambda^2/f$$

In Example 3, the optical axis 10 is perpendicular to the wavelength locking element (an element on the transparent substrate 3 including the waveguide layer 4 and the grating coupler 5). Therefore, the adjustment can be simplified compared to the conventional technique. first, the distance from the light source (semiconductor laser) 1 should be adjusted, and the position of the center O of the grating coupler 5 needs to be adjusted. The structure according to Example 3 can be further simplified since a collimator lens 2 is not necessary unlike the conventional technique or Example 1. Moreover, resolution with 0.2 nm or less can be obtained at the focal length of about f=2–4 mm. Therefore, the size of the apparatus can be miniaturized to one-fifth or one-sixth of those of the conventional techniques. Similar effect can be obtained if the grating of the grating coupler 5 is formed on the waveguide layer 4. AR coating will be also effective in order that the feedback light beam is easily inputted to the output end face 1a of the semiconductor laser 1.

EXAMPLE 4

Figure 6:
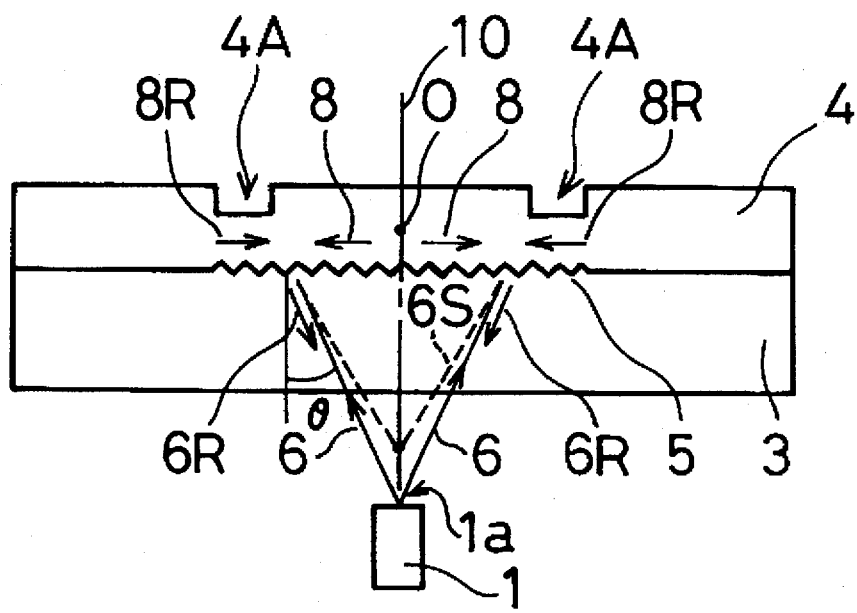
FIG. 6 is a cross-sectional view showing the structure of a wavelength locking device according to Example 4 of the present invention.
Figure 7:
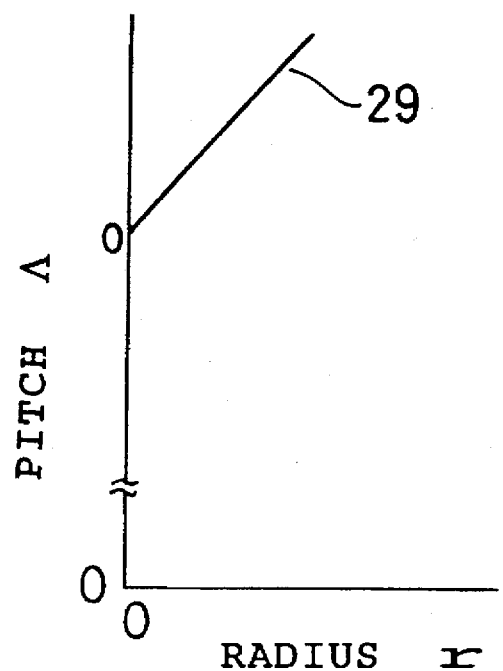
FIG. 7 is a diagram illustrating the relation between the grating pitch and the radius according to Example 4.
Figure 8:
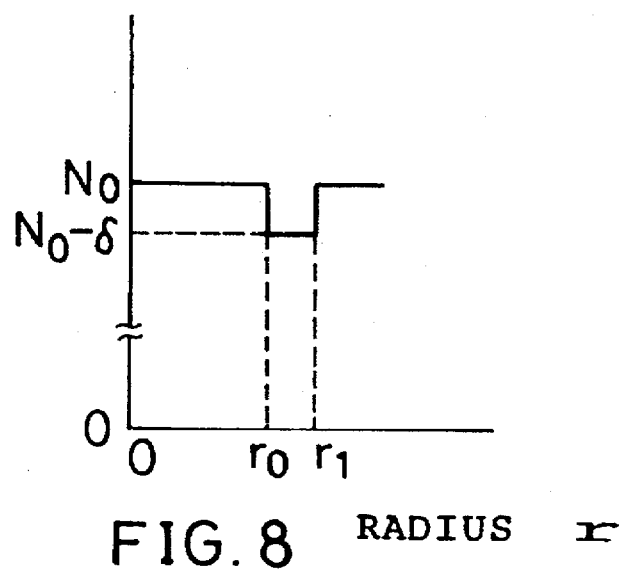
FIG. 8 is a diagram illustrating the relation between the equivalent refraction index and the radius according to Example 4.

Example 4 relates to a wavelength locking divide of the present invention, and can be explained referring to FIGS. 6, 7 and 8. The structures common to those of Example 2 are indicated with the same number and the explanation will be omitted. FIG. 4 is a cross-sectional view showing the structure of the wavelength locking device of Example 3, which is similar to that of Example 2 except the specification of pitches and the thickness of the waveguide layer 4. The grating pitch in Example 4 indicates that the relation inside the radius $r_o$ of Example 3 is expanded to the whole region as shown by the characteristic curve 29 of FIG. 7, which can be presented by the following formula.

$$\Lambda = \lambda/(N_o - n \cdot \sin\theta)$$

In this formula, n is the refractive index of the transparent substrate 3, $\theta$ is the incident angle to the grating coupler 5, and $\Lambda$ is the grading pitch at the incident position. On the other hand, the waveguide layer 4 has been etched in the annular region 4A (radius $r_o - r_1$), thus the region 4A is thinner than the other regions. The result is indicated in FIG. 8. The equivalent refractive index (N) of the waveguide layer is lower in the region of radius $r_o - r_1$ by $\delta$ than the other regions, as shown in the following formula.

$N = N_o$, when $r \leq r_o$ or $r \geq r_1$ $N = N_o - \delta$, when $r_o < r < r_1$ As clear from this formula and an above-mentioned formula ($\Lambda = \lambda/(N_o - n \cdot \sin\theta)$), inside the radius $r_o$, the light beam which enters the respective positions of the grating coupler 5 excites the waveguide light beam 8 which moves from the center to the periphery. And $\theta_1$ is denoted as an incident angle to the grating coupler 5 at where radius $(r_o + r_1)/2$. At this case, $\delta = 2n \cdot \sin\theta_1$, and at the position of radius $(r_o + r_1)/2$, the waveguide light beam 8R which moves from the periphery to the center is excited. And on the region of radius $r_o < r < r_1$, the phase matching condition does not differ so much. As a whole, the waveguide light beam 8R which moves from the periphery to the center O is excited. The waveguide light beam 8R pass through radius $r_o$ and reaches the inside, and is radiated from the grating coupler 5. Then the radiant beam 6R becomes a reverse light beam of the inputted light at the irradiation position. In other words, the radiant beam 6R is fed back to the semiconductor laser 1.

According to above formula, namely $N = N_o$, when $r \leq r_o$ or $r \geq r_1$ $N = N_o - \delta$, when $r_o < r < r_1$, the radiant beam 6R which is a feedback light from the grating coupler 5 has wavelength selectivity. Since the radiant beam 6R is fed back to the laser end face 1a of the semiconductor laser 1, the wavelength of the laser is locked. In other words, if the wavelength $\lambda$ shown in this formula and the standard wavelength $\lambda_o$ of the semiconductor laser 1 are within the scope shown in the following formula $|\lambda - \lambda_o| < 10$–$50$ nm, the wavelength of the semiconductor laser 1 is locked to $\lambda$.

In another case like the above-mentioned Examples, a light beam with wavelength $\lambda$ is radiated from the semiconductor laser 1, inputted and outputted at the grating coupler 5, and fed back with accuracy to an output end face 1a of the semiconductor laser 1. Since a part of the light radiated from the semiconductor laser 1, for example a light beam with wavelength of $\lambda - \Delta$, does not agree on the optimum input condition ($\Lambda = \lambda/(N_o - n \cdot \sin\theta)$), the input efficiency will be deteriorated. Moreover, the radiant beam 6R deviates from the reverse, direction of the inputted light beam at the irradiation position and is fed back as shown by the broken line 6S of FIG. 6. As a result, the collimating point is inclined from the end face 1a of the semiconductor laser 1 to the optical axis. The resolution of the wavelength locking device in the wavelength selectivity is determined by the synergistic action, and the resolution in Example 4 can be approximately presented like Example 3 by the following formula.

$$\Delta = (0.6-1.2) \cdot \lambda^2/f$$

In Example 4, the optical axis is perpendicular to the wavelength locking element (the element including the waveguide layer 4 and the grating coupler 5). Therefore, it is just necessary to adjust the distance from the light source and the position in the surface perpendicular to the optical axis 10 of the center O of the grating coupler. In addition, unlike the conventional techniques or Example 1, a collimator lens 2 is not required. As a result, the structure can be simplified. Moreover, resolution with 0.2 nm or less can be obtained at the focal length of about f=2–4 mm. Therefore, the size of the apparatus can be miniaturized to one-fifth or one-sixth of those of the conventional techniques. As shown in FIG. 5, the pitch according to Example 3 has a irregular relation with the radius while FIG. 7 shows that the pitch according to Example 4 has a regular relation with the radius. Therefore, grating can be formed easily even if a step of waveguide layer etching is added. The grating of the grating coupler 5 can also be formed on the waveguide layer 4. In this example, the equivalent refractive index of the region 4A was lowered by etching the waveguide layer 4. The same effect can be obtained by another way: forming a loading layer (a transparent layer of $SiO_2$ etc. with lower refractive index) and eliminating the loading layer in the region of 4A in order to differentiate the equivalent refractive indexes.

EXAMPLE 5

Figure 9:
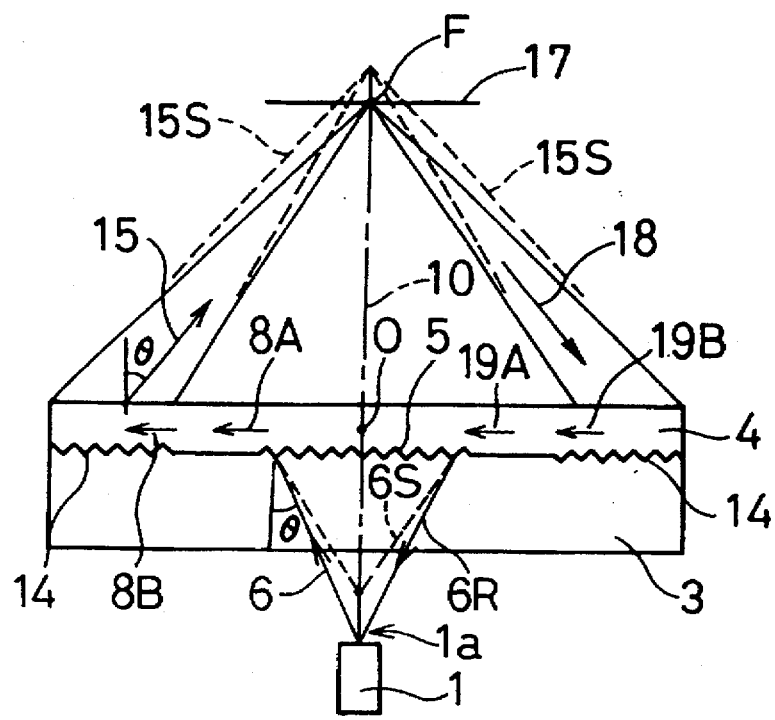
FIG. 9 is a cross-sectional view showing the structure of a wavelength locking device according to Example 5 of the present invention.
Figure 10:
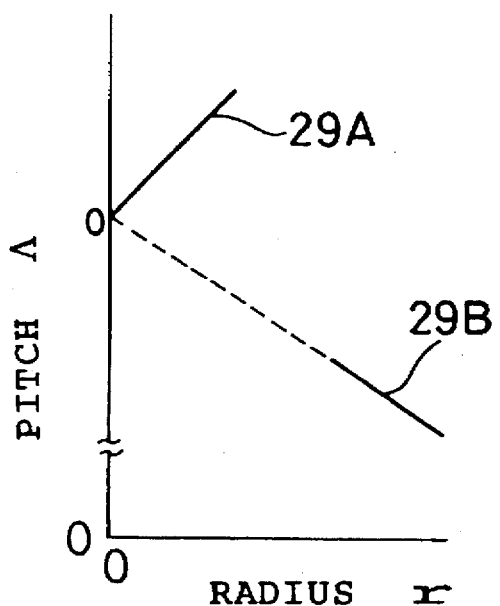
FIG. 10 is a diagram illustrating the relation between the grating pitch and the radius according to Example 5.

Example 5 relates to a wavelength locking device of the present invention, and can be explained referring to FIGS. 9 and 10. The structures common to those of Example 2 are indicated with the same number and the explanation will be omitted. FIG. 9 is a cross-sectional view showing the structure of the wavelength locking device of Example 5. As shown in FIG. 9, grating couplers 5 and 14 which have concentric circular shape with a center O are respectively formed on the circular region with a center O and the annular region around the circular region on the transparent substrate 3 of materials like quartz. And a waveguide layer 4 is formed thereon. The waveguide layer 4 is made of films of SiN, SiON or $Ta_2O_5$ etc., or a mixed film of $Ta_2O_5$ and $SiO_2$, or a laminated films of these compounds. The light beam 6 radiated from the semiconductor laser 1 passes through the transparent substrate 3 disposed in order to cross perpendicularly the optical axis 10, and enters the waveguide layer 4. The semiconductor laser 1 is disposed so that the optical axis 10 passes through the center O of the grating coupler 5. The pitch of the grating coupler 5 shown with the characteristic curve 29A in FIG. 10 is presented by an abovementioned formula ($\Lambda=\lambda/(N_o-n\cdot\sin\theta)$) as in the Example 4. The pitch of the grating coupler 14 shown with the characteristic curve 29B in FIG. 10 is presented by the following formula.

$$\Lambda=\lambda/(N_o+\sin\theta)$$

In this formula, $\theta$ is the incident angle from the grating coupler 5, and $\Lambda$ is the grading pitch at the position of radiant angle $\theta$. Based on the above-mentioned formula ($\Lambda=\lambda/(N_o-n\cdot\sin\theta)$), the light which enters the respective positions of the grating coupler 5 excites the waveguide light beam 8A moving from the center to the periphery. The waveguide light beam 8A moves to the periphery, radiated from the grating coupler 14 and becomes the radiant beam 15. The radiant beam 15 is converging, so that it is collimated to the point F on the reflecting surface 17 disposed to be perpendicular to the optical axis 10. The light beam 18 reflected by the reflecting surface 17 enters the grating coupler 14 and excites a waveguide light beam 19B moving from the periphery to the center, based on the above formula ($\Lambda=\lambda/(N_o+\sin\theta)$). The feedback waveguide light beam 19A is the reverse wave of the inputted waveguide light beam at the transmission position. Therefore, if the waveguide light beam 19A is radiated from the grating coupler 5, the radiant beam 6R also becomes a reverse wave of the inputted light beam at the radiating position. In other words, the radiant beam 6R is fed back to the semiconductor laser 1 accurately.

It is clear from the formulas, namely $$\Lambda=\lambda/(N_o-n\cdot\sin\theta)$$

$$\Lambda=\lambda/(N_o+\sin\theta),$$

that the radiant beam 6R which is a feedback light from the grating couplers 5 and 14 has a wavelength selectivity. When the radiant beam 6R is fed back to the output end face 1a of the semiconductor laser 1, the wavelength of the laser is locked. In other words, if the wavelength $\lambda$ shown in these formulas and the standard wavelength $\lambda_o$ of the semiconductor laser 1 are within the scope shown in the formula ($|\lambda-\lambda_o|<10-50$ nm), the wavelength of the semiconductor laser 1 is locked to $\lambda$.

In another case like the above-mentioned Examples, a light beam with wavelength $\lambda$ is radiated from the semiconductor laser 1, inputted and outputted at the grating couplers 5 and 14, and fed back with accuracy to an output end face 1a of the semiconductor laser 1. Since a part of the light radiated from the semiconductor laser 1, for example a light beam with wavelength of $\lambda-\Delta$, does not agree on the optimum input condition ($\Lambda=\lambda/(N_o-n\cdot\sin\theta)$), the input efficiency will be deteriorated. In addition, the radiant angle of the radiant beam at the grating coupler 14 changes and the collimating position moves along the direction of the optical axis as shown by the broken line 15S. As a result, the input efficiency of an radiant beam to the waveguide light beam will be deteriorated (the light beam has been reflected by the reflective surface 17 and entered the grating coupler 14). Moreover, the radiant beam 6R from the grating coupler 5 deviates from the reverse direction of the inputted light beam at the irradiation position and is fed back as shown by the broken line 6S. As a result, the collimating point is inclined from the end face 1a to the optical axis. The resolution of the wavelength locking device in the wavelength selectivity is determined by the synergistic action, and the resolution in Example 5 becomes one-fifth or one-sixth of the resolution presented in the formula ($\Delta=(0.6-1.2)\cdot\lambda^2/f$), since unlike the case of Example 2, the effect of input-output of light at the grating coupler 14 is also added.

Though a collimator lens 2 is not necessary for Example 5, a reflecting surface 17 is needed. Moreover, not only the position adjustment of the light source and the wavelength locking element (the element on the transparent substrate 3 including the waveguide layer 4 and the grating couplers 5, 14), but also the position adjustment of the wavelength locking element and the reflecting surface 17 is required. As a result, both the structure and the adjustment become complicated, but the resolution in the wavelength selectivity is superior to those of conventional techniques or of the other Examples. The same effect can be obtained if the gratings of grating couplers 5 and 14 are formed on the waveguide layer 4. It is also preferable that the output end face 1a of the semiconductor laser 1 is coated so that the feedback light will be easily inputted.

EXAMPLE 6

Figure 11:
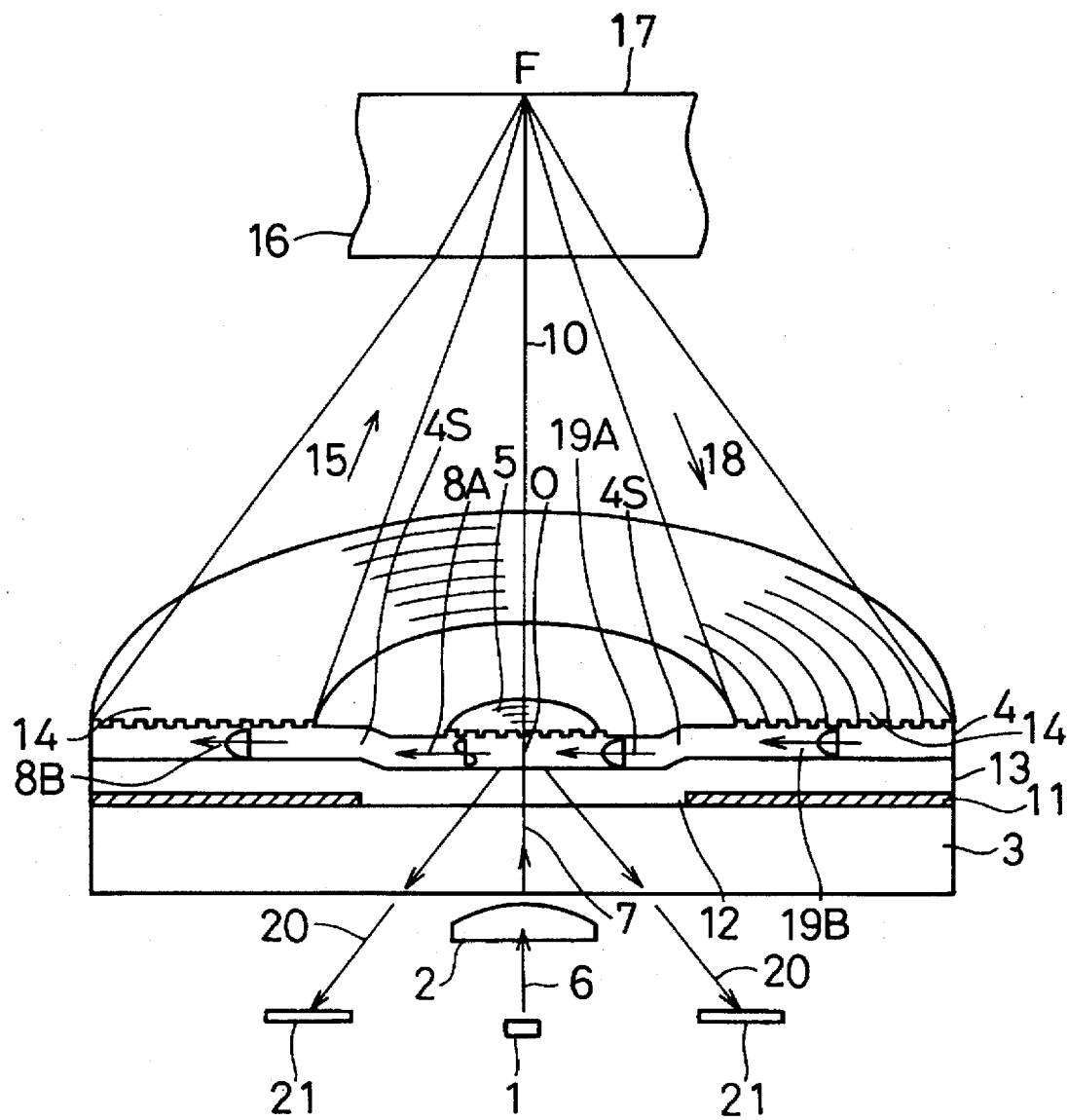
FIG. 11 is a cross-sectional view showing the structure of a beam collimating device and an optical disk apparatus according to Example 6 of the present invention.

Example 6 relates to a beam collimating device and an optical disk apparatus to which the beam collimating device is applied, and can be explained referring to FIGS. 11 to 15. FIG. 11 is a partially cross-sectional view showing the structure of the beam collimating device and the optical disk apparatus in Example 6. In FIG. 11, a metal reflecting layer comprising metals like Al or Cr is formed on the transparent substrate 3, and a circular region 12 with its center O is etched thereon. On the metal reflecting layer 11, a buffer layer 13 including materials like $SiO_2$ and thereon, a waveguide layer 4 is formed. The waveguide layer 4 comprises a film made from materials like SiN, SiON, or $Ta_2O_5$, or a mixed film of $Ta_2O_5$ and $SiO_2$, or a laminated layer made of these materials. In the circular region 12, the buffer layer 13 is directly contacted with the transparent substrate 3, and the surface of the buffer layer 13 becomes an offset structure at the peripheral part 4S of the circular region 12. And the waveguide layer 4 is bent at this site 4S. On the waveguide layer 4, a concentric circular grating coupler 5 of which center is O (pitch $\Lambda_o$) is formed within the circular region 12. On the annular site corresponding to the outside of the circular region 12, a concentric circular grating coupler 14 (pitch $\Lambda_1$) having O at its center is formed. The light beam 6 radiated from the semiconductor laser 1 is made a parallel light beam 7 by a collimator lens 2, passes through the transparent substrate 3 which is disposed to perpendicularly cross the optical axis 10, passes the buffer layer 13, and enters perpendicularly the waveguide layer 4 so that the optical axis 10 passes the center O of the grating coupler 5. Like Example 1, a light beam which enters the respective positions of the grating coupler 5 excites two kinds of first waveguide light beams simultaneously: the one moving from the center O to the periphery and the other moving from the periphery to the center O. Both of the waveguide light beams are excited to be light beams radiated to cross perpendicularly the waveguide layer 4. The light beams are partially fed back to the semiconductor laser 1 by the collimator lens 2, and lock the wavelength of the laser.

When the equivalent refractive index of the waveguide layer 4 to the first-order mode waveguide light beam 8A is denoted as $N_o$, the grating coupler 5 excites the waveguide light beam. In other words, the condition to feed the light back to the semiconductor laser 1 has been given in the following formula.

$$\lambda = N_o \Lambda_o$$

A first-order mode waveguide light beam 8A passes through the offset part 4S of the waveguide layer 4 and a part of 8A changes into a zeroth order mode waveguide light beam 8B. The waveguide light beam 8B is radiated from the grating coupler 14. The radiant beam 15 is a converging light beam to point F. When the equivalent refractive index of the waveguide layer 4 to the zeroth-order mode waveguide light beam 8B is $N_1$ and the angle made by the radiant beam 15 and the waveguide layer normal line (i.e., the incident optical axis 10) is $\theta$, the pitch $\Lambda_1$ of the grating coupler 14 meets the requirement of the following formula.

$$\sin\theta = \lambda/\Lambda_1 - N_1$$

The radiant beam 15 passes through a transparent disk substrate 16 and focuses at the point F on the reflecting surface 17. The light beam 18 reflected by the reflecting surface 17 enters the grating coupler 14 and excites a zeroth order mode waveguide light beam 19B. Some components of the waveguide light beam 19B remain unchanged in mode even after passing through the offset part 4S. Thus the components are radiated from the grating coupler 5. The radiant beam 20 is radiated to the radiant optical axis 10 with an angle corresponding to $\sin^{-1}(N_1-N_o)$, and then intercepted by an optical detector 21. Reasonably, some components are fed back to the grating coupler 5 and radiated in the condition of the first-order mode waveguide light beam. In the same way as Example 5, such components are fed back to the semiconductor laser 1 and assist the locking of the wavelength of the laser.

As shown in the above formula, the radiant angle $\theta$ of the radiant beam 15 from the grating coupler 14 easily changes due to the changes of wavelength, and the focus F also changes drastically. When the focal length of the grating coupler 14 is 2 mm, the focus changes about 16 μm in accordance with the change of 1 nm in the wavelength. Accordingly, a collimating position drastically hops if a mode-hopping is generated in the light source 1. Therefore, a collimating element with a grating coupler has been inappropriate to a collimating element as an optical head for a conventional optical disk. According to the structure of Example 6 is, however, the light beam fed back from the grating coupler 5 locks the laser wavelength of the semiconductor laser 1. Therefore, no mode-hopping is generated, or the collimating position does not change. In addition, wavelength change is not generated between the reproducing mode and the recording mode of the laser (i.e., the height difference between the quantity of the generated light), so that achromaticity of the lens does not need any special adjustment. Achromatic means combining glass materials with different dispersing properties and cancelling tilts of the collimating point due to the change of wavelength, and an achromat has been tried for the conventional recording optical head. Furthermore, the embodiment of this invention does not need a high-frequency superposed circuit which has been adapted for the conventional optical head, since mode-hopping is not generated. A high-frequency superposed circuit is used for making the oscillation of the laser multi-mode and decreasing the coherence in order to control the noise-generation accompanied by a mode-hopping. As a result, the cost for an optical head can be decreased.

Figure 12:
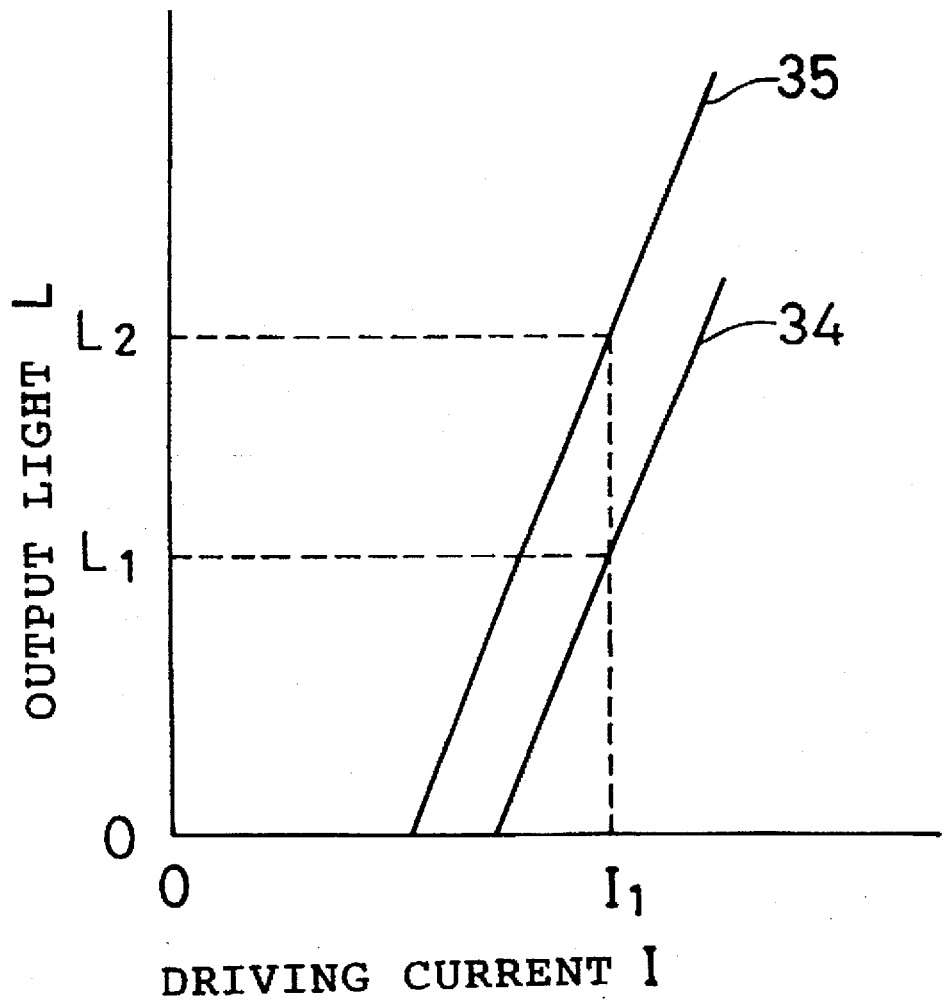
FIG. 12 is a drawing explaining the principle of signal reproduction of the optical disk apparatus according to Example 6.

Next, a case in which signals of an optical disk is reproduced in Example 6 will be described. If pit mark or dot mark (a signal having difference in reflecting index) are formed on a reflecting surface 17 like an optical disk, the light quantity which is detected by an optical detector 21 changes as a converging light beam scans on the signal. Therefore, it is possible to denote the change of the light quantity detected by the optical detector 21 as a reproducing signal. On the other hand, the following principle of signal reproduction can be also considered. The quantity of light which is fed back to the grating coupler 5 to be radiated changes since a converging light scans on the signal. Then the quantity of feedback light to the semiconductor laser 1 also changes. FIG. 12 indicates that in general, IL property of a laser shifts to the side of lower current (from the characteristic curves 34 to 35) as the quantity of feedback light to the semiconductor laser 1 increases. Then, the signals on the reflecting surface 17 can be read by locking the driving current at $I_1$ and detecting the change of the optical output from $L_1$ to $L_2$). IL property means the relation between the quantity of output light L and the driving current I. If the optical output is controlled to be fixed, the signal on the reflecting surface 17 appears as the change of the value of the driving current, so that the change of current value (or a change of voltage value attained from the current value) also can be the reproducing signal. Generally, in signal reproducing utilizing the changes of the quantity of light fed back to the semiconductor laser 1, the increasing noise by the feedback light will be a problem, because plural modes between the different frequencies (wavelengths) will generate beat. According to the present invention, however, generation of beat is controlled since the wavelength of the feedback light can be selected. Thus a signal reproduction with lower noise is realized.

Figure 13:
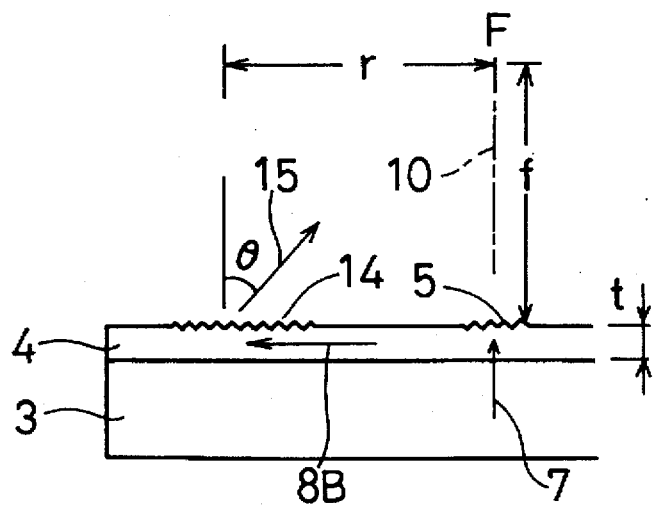
FIG. 13 is a diagram illustrating the change of the longitudinal aberration property which follows the wavelength locking property according to Example 6.
Figure 14:
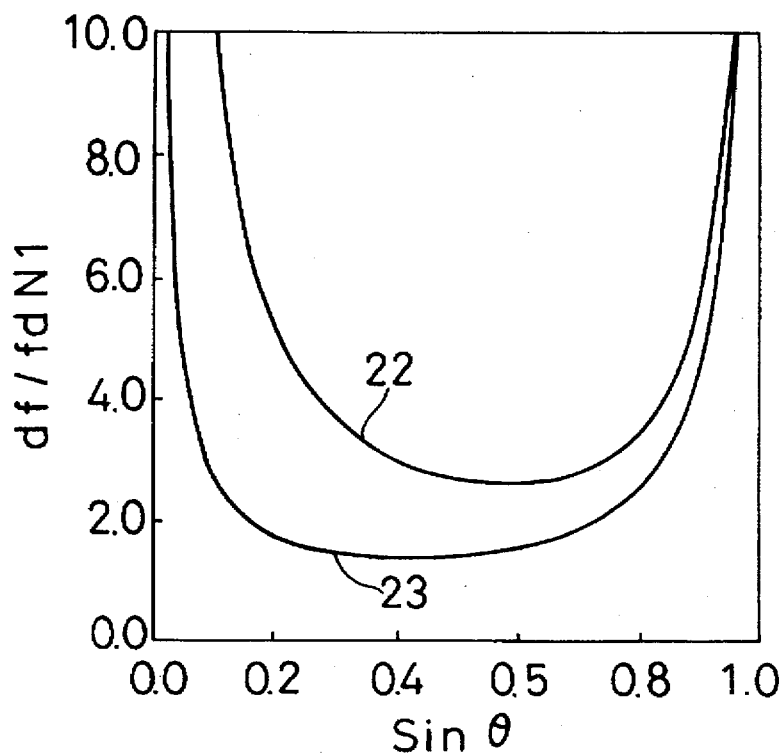
FIG. 14 is a diagram comparing the longitudinal aberration properties according to Example 6.

FIG. 14 shows the longitudinal aberration property changes due to the wavelength locking function of the beam collimating device in Example 6. As shown in FIG. 13, an angle $\theta$ between the radiant beam 15 and a waveguide layer normal line (i.e., incident optical axis 10) is presented geometrically by the following formula in which r is a radius of the radiant position and f is a focal length. Though the formula could be more complicated if a transparent substrate 16 is sandwiched between the device and the collimating point F, the transparent substrate 16 is omitted in the following explanation.

$$\tan\theta = \tau/f$$

When the wavelength is not locked, the above mentioned formulas ($\sin\theta = \lambda/\Lambda_1 - N_1$, and $\tan\theta = \tau/f$) become simultaneous equations to calculate a degree of change of collimating point df (i.e., the degree of change of focal length) according to the difference of equivalent refractive index generated by the difference of refractive index and the thickness of the waveguide layer 4. In the following formulas, the difference of the equivalent refractive index means the difference of $dN_o$, $dN_1$ to $N_o$, $N_1$.

$$df = -fdN_1/\sin\theta\cos^2\theta$$

When the waveguide is locked, another formula ($\lambda = N_o\Lambda_o$) holds. On this condition, the above-mentioned two formulas ($\sin\theta = \lambda/\Lambda \cdot_1 - N_1$, and $\tan\theta = \tau/f$) become simultaneous equations to find the value of df as indicated in the following formula.

$$df = \frac{(fdN_0/N_0)(\sin\theta + N_1 - N_0 dN_1/dN_0)}{\sin\theta \cdot \cos^2\theta}$$

Figure 15:
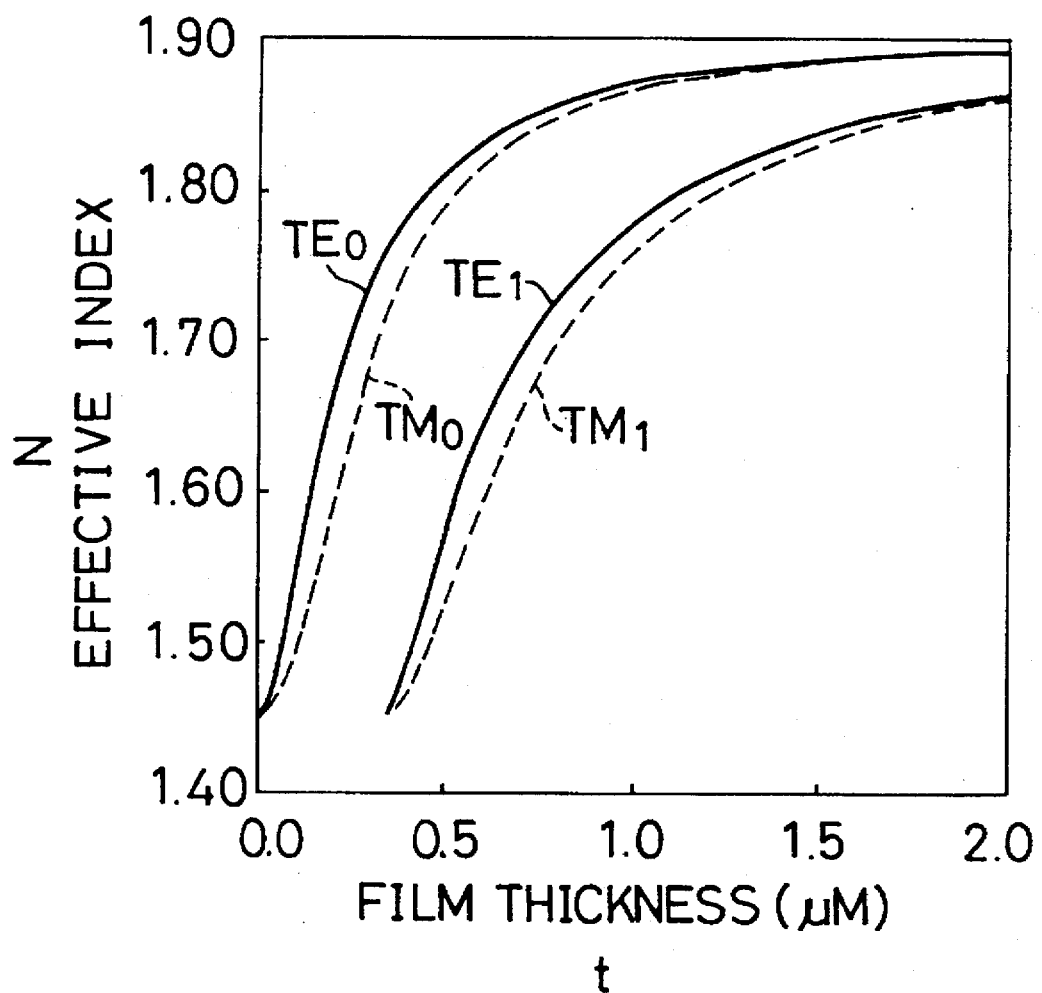
FIG. 15 is a diagram illustrating the dispersion properties of the waveguide layers according to Example 6.

In this formula, the values of the right-hand side ($\sin\theta + N_1$) and that of the left-hand side ($N_o dN_1/dN_o$) are generally approximate so that the differences can cancel each other. In FIG. 14, the difference between longitudinal aberration properties of the characteristic curves 22 and 23. The curve 22 indicates a case without wavelength locking, while 23 indicates the case with wavelength locking. The horizontal axis indicates the radiant position ($\sin\theta$), and the vertical axis indicates the longitudinal aberration quantity ($df/fdN_1$). The characteristic curve 22 plots the value of $-df/fdN_1$. The value of the longitudinal aberration quantity $df/fdN_1$ is not required to be zero. It is preferable that the deviation within the aperture is smaller. It is further preferable that the deviation is zero. The curves 22 and 23 are compared in the figure. When the wavelength is not locked, the aperture with less deviation of the longitudinal aberration quantity is limited to the annular, namely, NA(=$\sin\theta$)=0.4–0.7. When the wavelength is locked, the limitation is drastically relaxed, namely an aperture which is almost circular (NA= 0.15–0.7) is also allowed. As mentioned above, a wavelength is locked according to Example 6. Therefore, it is possible to cancel the aberration effect due to the differences of the equivalent refractive index of the waveguide layer 4, and the limitation to the aperture is also relaxed drastically. Calculating the curve 23, dispersive property of the waveguide layer 4 is required. FIG. 15 indicates an example of the dispersive properties of a waveguide layer. Namely, the relation between the thickness of a waveguide layer (t) and the equivalent refractive index of every mode (N) when a waveguide layer with refractive index of 1.90 is sandwiched between transparent media with the refractive index of 1.45. When t is 0.4 μm, a light beam is inputted to the grating coupler 5 at $TM_1$ mode, and radiated from the grating coupler 14 and collimated at $TM_o$ mode. In this case, $N_o$=1.77, $N_1$=1.47, $dN_1/dN_o$=1.0, and the curve 23 is the solution under the condition.

In Example 6, the grating couplers 5 and 14 are formed on the waveguide layer 4. The same effect can be obtained if the grating couplers are formed under the waveguide layer 4, namely, on the transparent substrate 3 or on the buffer layer 13. In Example 6, the laser beam 6 is parallelled by the collimator lens 2. The collimator lens 2, however, can be omitted from the wavelength locking method as shown in Examples 2–5. Or in Example 6, the inputted waveguide mode 8A at the grating coupler 5 is different from the pre-radiation waveguide mode 8B at the grating coupler 14. The same effect can be obtained if the two modes are the same. Also, the degrees like zeroth-order mode or first-order mode can be altered.

EXAMPLE 7

Figure 16:
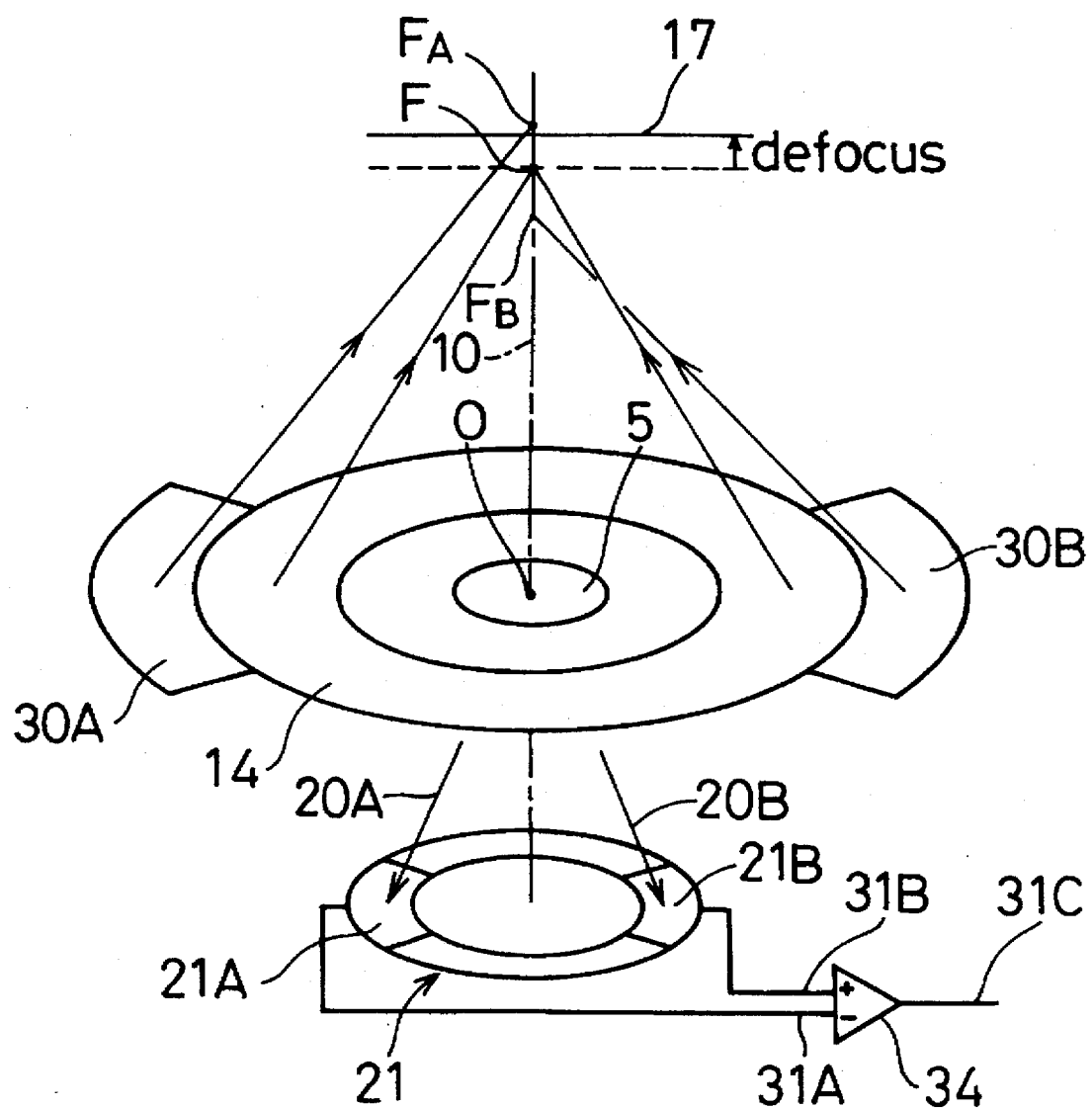
FIG. 16 is a perspective view showing the structures of a beam collimating device and a optical disk apparatus according to Example 7 of the present invention.
Figure 17:
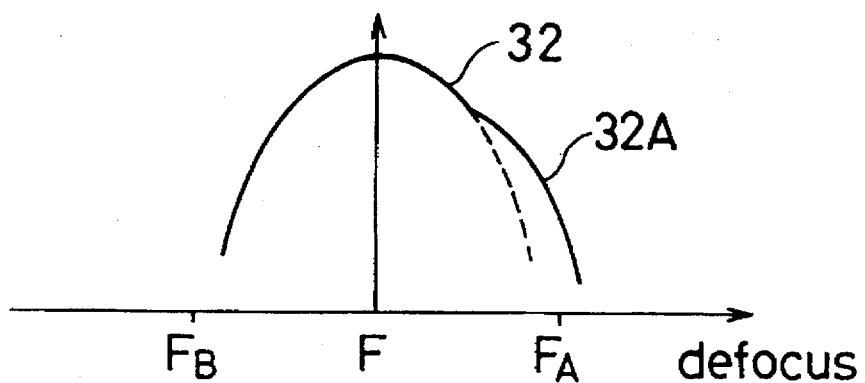
FIGS. 17 (A)–(C) are drawings explaining the properties of the light-intercepting signals of the optical detectors and the principles of focusing error detection according to Example 7 of the present invention.
Figure 17:
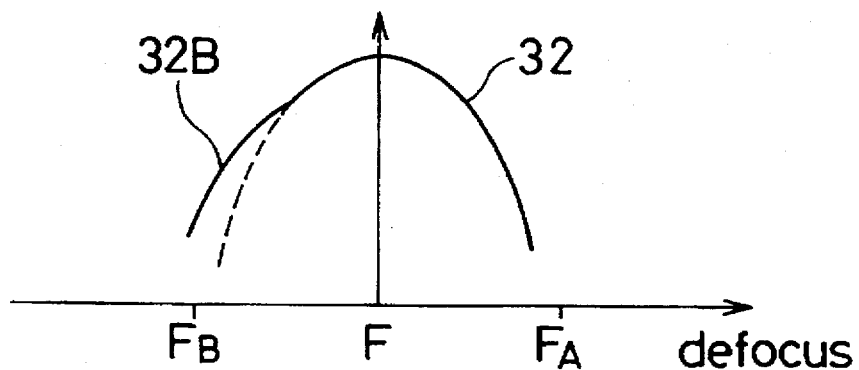
Figure 17:
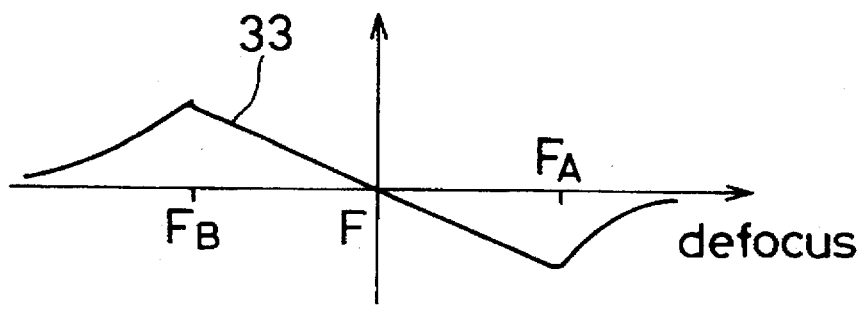

Example 7 relates to a beam collimating device and an optical disk apparatus to which the beam collimating device is applied, and can be explained referring to FIGS. 16 and 17. FIG. 16 is a perspective view showing the structures of the beam collimating device and the optical disk apparatus of Example 7. FIGS. 17(a)–(c) respectively show the principle of focusing error signal detection. FIG. 16 shows that according to Example 7, grating couplers 30A and 30B are disposed outside of the grating coupler 14. The structure is as same as that of Example 6, except that the optical detector 21 is divided in another way.

The grating couplers 30A and 30B are formed in a concentric circle on or under the waveguide layer 4, and the center of the grating is denoted O. And the two grating couplers are shaped hollow sector form and placed symmetrically. The grating pitches of the grating couplers 30A and 30B are different from those of grating coupler 14. The waveguide light beam which has been inputted to the grating coupler 5 and passes through the grating coupler 14 is radiated from the grating couplers 30A and 30B, then focused to the points $F_A$ and $F_B$ on the optical axis 10. On the other hand, the radiant beam from the grating coupler 14 is focused at F which is the midpoint of $F_A$ and $F_B$. The waveguide light beam is reflected by the reflecting surface 17 disposed to cross perpendicularly the optical axis 10, inputted to the grating couplers 30A, 30B and 14, and fed back. Some off-axis components are fed back into a waveguide mode of the grating waveguide coupler 5, which is different from the waveguide mode excited by light incident on the waveguide coupler directly from the light source. The light in the different waveguide mode is diffracted out of the waveguide coupler 5 off-axis and is incident on the annular optical detector 21. The optical detector 21 is divided into two hollow sector regions 21A and 21B which are disposed symmetrically corresponding to the grating couplers 30A and 30B.

The equivalent refractive index of the waveguide light beam inputted by the grating coupler 5 is denoted $N_o$, and the equivalent refractive index radiated from the grating coupler 5 to the side of the optical detector is denoted $N_1$. When $N_1 > N_o$, the feedback waveguide light beams transmitted from the grating couplers 30A and 30B are of the waveguide light beam radiated to the optical detectors 21B and 21A respectively. When $N_1 < N_o$, the feedback waveguide light beams are radiated to the optical detectors 21A and 21B respectively. The latter example will be taken for explanation. The intercepting signals 31A and 31B of the optical detectors 21A and 21B respectively have properties shown as (a) and (b) in FIG. 17, because of the defocusing of the reflecting surface 17. The characteristic curve 32 indicates the components inputted by the grating coupler 14. The light is dispersed by the pit marks or dot marks on the reflecting surface 17, and the reflected light beam is diffracted to the regions of the grating couplers 30A and 30B. Therefore, as the reflecting surface 17 approaches to the point $F_A$, the components inputted by the grating coupler 30A is amplified. As a result, the parabola of the curve 32 becomes discontinuous at the part of 32A. In the same way, as the reflecting surface 17 approaches to the point and the components inputted by the grating coupler 30B is amplified. Thus the parabola of the curve 32 becomes discontinuous at the part of 32B. Accordingly, the difference signal 31C of the intercepting signals 31A and 31B is taken by the difference circuit 34. As a result, a sigmoidal curve 33 is obtained as shown in FIG. 17(c), which can be denoted as a focusing error signal of the reflecting surface 17. If the focusing error signal is controlled to be zero, the focused collimating point F of the radiant beam from the grating coupler 14 is controlled its position on the reflecting surface 17, and the IL property of the semiconductor laser 1 changes due to the sum signal of the optical detector 21 and the change of the quantity of feedback light. Thus the signal on the reflecting surface 17 can be reproduced.

EXAMPLE 8

Figure 18:
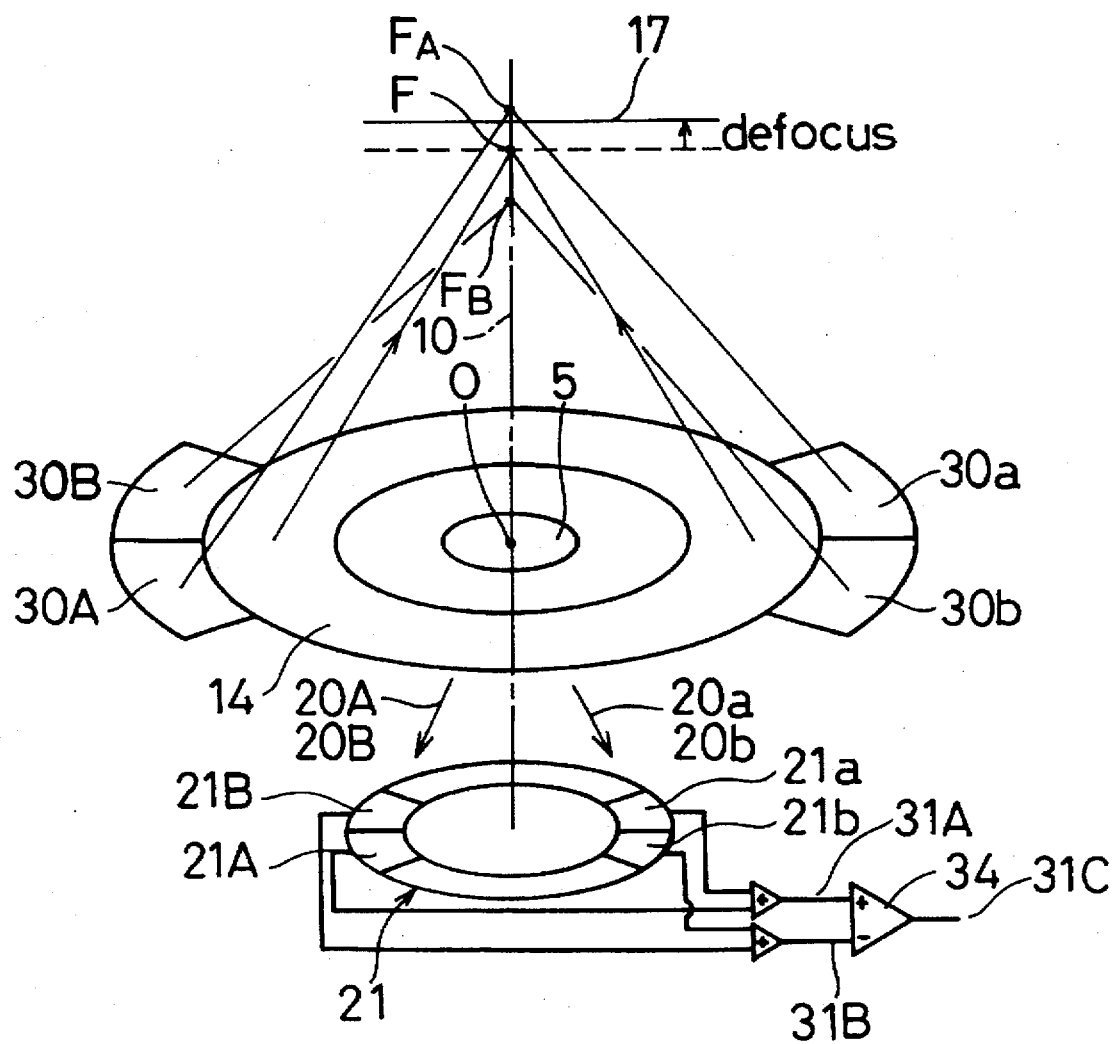
FIG. 18 is a perspective view showing the structures of a beam collimating device and a optical disk apparatus according to Example 8 of the present invention.
Figure 19A:
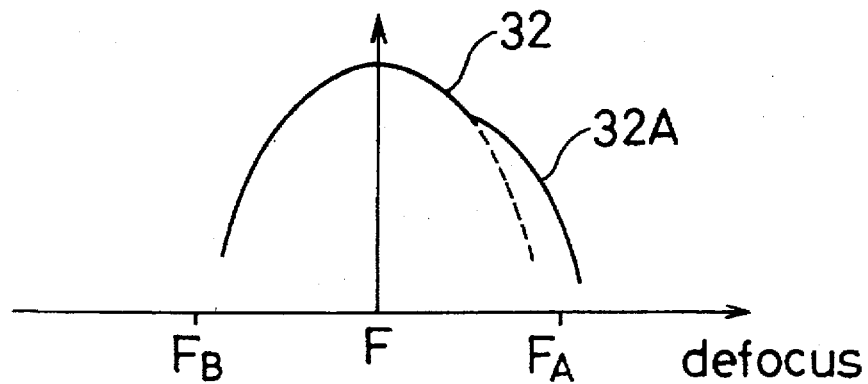
FIGS. 19 (A)–(C) are drawings explaining the properties of the light-intercepting signals of the optical detectors and the principles of focusing error detection according to Example 8 of the present invention.
Figure 19B:
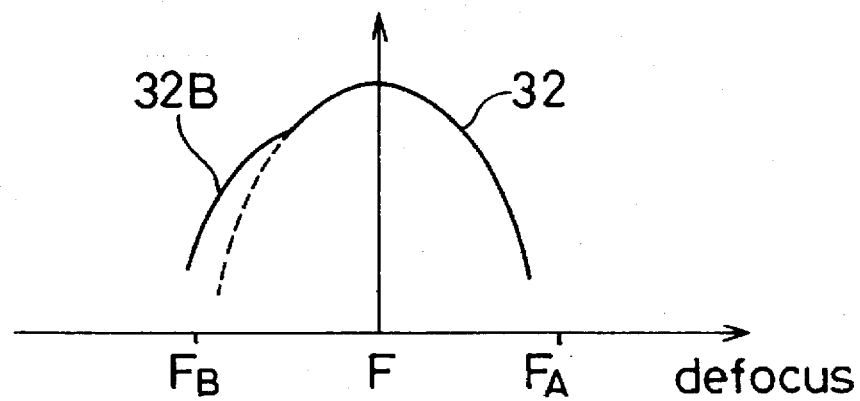
Figure 19C:
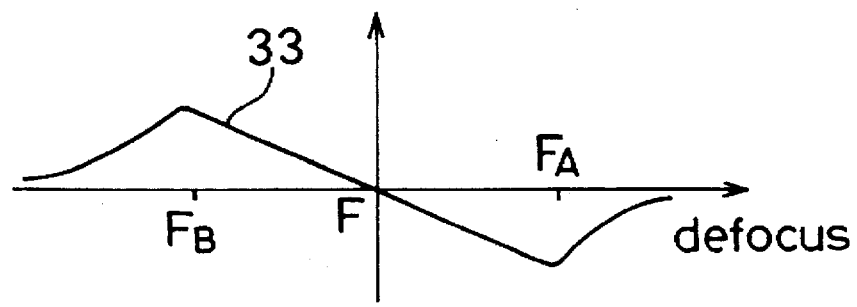
Figure 20:
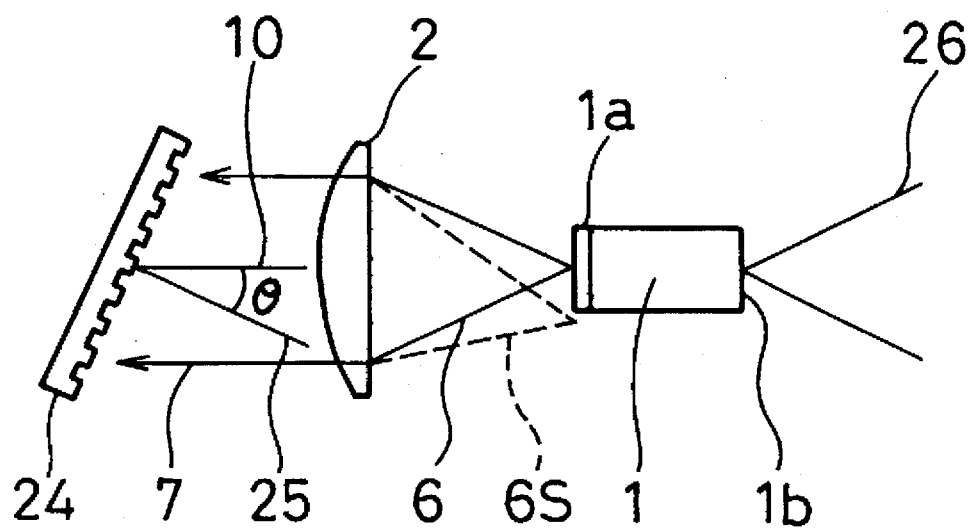
FIG. 20 is a cross-sectional view showing the structure of a wavelength locking device according to a conventional technique.

Example 8 relates to a beam collimating device and an optical disk apparatus to which the beam collimating device is applied, and can be explained referring to FIGS. 18 and 19. FIG. 18 is a perspective view showing the structures of the beam collimating device and the optical disk apparatus of Example 8. FIGS. 19(a)–(c) respectively show the principle of focusing error signal detection. According to Example 8, four grating couplers (30A, 30B, 30a, 30b) are disposed outside of the grating coupler 14. The structure is as same as that of Example 6, except that the optical detector is divided in another way. Identical numbers are attached to the structures common to those of

EXAMPLES 6 AND 7

The grating couplers 30A, 30B, 30a and 30b are formed in a concentric circle on or under the waveguide layer 4, and the center of the grating is denoted O. The two grating couplers are shaped hollow sector form and 30A-30a, 30B-30b are respectively placed symmetrically. The grating pitches of the grating couplers 30A, 30B, 30a and 30b are different from those of grating coupler 14.

The waveguide light beam which has been inputted to the grating coupler 5 and passes through the grating coupler 14 is radiated from the grating couplers 30A and 30a, then focused to the points $F_A$ on the optical axis 10. The waveguide light beam is also radiated from the grating couplers 30B and 30b and focused to the point $F_B$ on the optical axis 10. The radiant beam from the grating coupler 14 is focused at F which is the midpoint of $F_A$ and $F_B$. The waveguide light beam is reflected by the reflecting surface 17 disposed to cross perpendicularly the optical axis 10, inputted to the grating couplers 30A, 30B, 30a, 30b and 14, and fed back. Some off-axis components are fed back into a waveguide mode of the grating waveguide coupler 5, which is different from the waveguide mode excited by light incident on the waveguide coupler directly from the light source. The light in the different waveguide mode is diffracted out of the waveguide coupler 5 off-axis and is incident on the annular optical detector 21.

The optical detector 21 is divided into hollow sector regions 21A, 21B, 21a and 21b which are disposed symmetrically corresponding to the grating couplers 30A, 30B, 30a and 30b. The regions 21A–21a and 21B–21b are disposed diagonally, The equivalent refractive index of the waveguide light beam inputted by the grating coupler 5 is denoted $N_o$, and the equivalent refractive index radiated from the grating coupler 5 to the side of the optical detector is denoted $N_1$. When $N_1 > N_o$, the feedback waveguide light beams transmitted from the grating couplers 30A, 30B, 30a and 30b are radiated to the regions (21a, 21b, 21A and 21B) of the optical detector 21 respectively. When $N_1 < N_o$, the feedback waveguide light beams are radiated to the regions (21A, 21B, 21a, 21b) of the optical detector 21 respectively.

The latter example will be taken for explanation. Due to the defocus by the reflective surface 17, the sum signal (31A) of optical detectors 21A and 21b has the property shown in FIG. 19 (a), while the sum signal (31B) of 21B and 21b has the property shown in FIG. 19(b). The characteristic curve 32 indicates the components inputted by the grating coupler 14. The components inputted by the grating coupler 30A and 30a are amplified the as the reflecting surface 17 approaches to the point $F_A$. Thus the parabola of the curve 32 becomes discontinuous at the part of 32A. In the same way, the reflecting surface 17 approaches to the point $F_B$, and the components inputted by the grating coupler 30B and 30b are amplified. Thus the parabola of the curve 32 becomes discontinuous at the part of 32B. Accordingly, the difference signal 31C of the intercepting signals 31A and 31B is taken by the difference circuit 34. As a result, a sigmoidal curve 33 is obtained as shown in FIG. 19(c), which can be denoted as a focusing error signal of the reflecting surface 17. If the focusing error signal is controlled to be zero, the focusing point F of the radiant beam from the grating coupler 14 is controlled its position on the reflecting surface 17, and the IL property of the semiconductor laser 1 changes due to the sum signal of the optical detector 21 and the change in quality of feedback light. Thus the signal on the reflecting surface 17 can be reproduced.

This invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A wavelength locking device comprising:

a laser light source having an anti-reflection coating on an output surface, a transparent substrate disposed so as to cross an optical axis of a laser beam radiated from said laser light source perpendicularly, a waveguide layer formed on said transparent substrate and having an equivalent refractive index N, and a light-coupling medium formed on or under said waveguide layer and having a concentric circular periodic structure with pitch Λ whose center is said optical axis, and wherein said laser beam excites a waveguide light beam, said waveguide beam moving from the center to the periphery and from the periphery to the center of said periodic structure in said waveguide layer, a part of said waveguide light beam is radiated in a direction substantially perpendicular to said waveguide layer and is fed back to said laser light source, thereby locking a wavelength λ of said laser beam to be λ=NΛ.

2. The waveguide locking device according to claim 1, wherein collimating means to collimate said laser beam to be parallel is disposed between said laser light source and said waveguide layer, and said laser beam enters almost perpendicularly the incident plane of said waveguide layer.

3. A wavelength locking device comprising:

a laser light source having an anti-reflection coating on an output surface;

a transparent substrate disposed so as to cross an optical axis of a laser beam radiated from said laser light source perpendicularly;

a waveguide layer formed on said transparent substrate; and a light-coupling medium formed on or under said waveguide layer and having a concentric circular periodic structure whose center is said optical axis;

wherein said laser beam excites a waveguide light beam moving from the periphery to the center of said periodic structure in said waveguide layer, said waveguide light beam passes through the center and is radiated from said light-coupling medium so as to be fed back to said laser light source, thereby locking a wavelength of said laser beam.

4. The waveguide locking device according to claim 3, which fulfills a condition presented by the following formula, $$\Lambda = \lambda/(N_o + n \cdot \sin\theta)$$

where $N_o$ is the equivalent refractive index of said waveguide layer, $\Lambda$ is the pitch of said light-coupling medium, $\theta$ is the incident angle of said laser beam to said light-coupling medium, n is the refraction index of said transparent substrate and $\lambda$ is a wavelength of light emitted by said laser light source.

5. A wavelength locking device comprising:

a laser light source having an anti-reflection coating on an output surface;

a transparent substrate disposed so as to cross an optical axis of a laser beam radiated from said laser light source perpendicularly;

a waveguide layer formed on said transparent substrate; and a light-coupling medium formed on or under said waveguide layer and having a concentric circular periodic structure whose center is said optical axis, said light-coupling medium being divided at a boundary of radius $r_0$ from said optical axis into an outside coupling portion and an inside coupling portion, said outside coupling portion having an outside coupling pitch and said inside coupling portion having an inside coupling pitch different from said outside coupling pitch;

wherein a first waveguide light beam moving from the periphery to the center is excited in said outside coupling portion, a second waveguide light beam moving from the center to the periphery is excited in said inside coupling portion;

the first waveguide light beam excited in said outside coupling portion moves from the periphery to the center and acrosses the boundary of radius $r_0$ and is radiated by said inside coupling portion, and fed back to said laser light source so as to lock a wavelength of said laser beam.

6. The waveguide locking device according to claim 5, wherein the pitch, $\Lambda$, fulfills the condition presented by the following formula, $$\Lambda = \lambda/(N_o - n \cdot \sin\theta)$$

when $r < r_o$, and $$\Lambda = \lambda/(N_o + n \cdot \sin\theta)$$

when $r > r_o$, where $N_o$ is the equivalent refractive index of said waveguide layer, $\theta$ is the incident angle of said laser beam to said light-coupling medium, n is the refractive index of said transparent substrate, $\lambda$ is a wavelength of light emitted by said laser light source, and r is a radial distance from said center of said concentric circular periodic structure.

7. The waveguide locking device according to claim 5, wherein said outside coupling portion has an outside effective refractive index different from an inside effective refractive index of said inside coupling portion, a waveguide light beam moving from the center to the periphery of the periodic structure is excited in said inside coupling portion, a waveguide light beam moving from the periphery to the center is excited in said outside coupling portion; the waveguide light beam moving from said periphery to the center is radiated from said inside coupling portion and is fed back to said laser light source so as to lock a wavelength of the laser beam.

8. The waveguide locking device according to claim 7, which fulfills the requirement presented by the following formula, $$\Lambda = \lambda/(N - n \cdot \sin\theta)$$

$$N = N_o$$

when $r \leq r_o$ or $r \geq r_1$, or $$N = N_o - \delta$$

when $r_o < r < r_1$, and $\delta = 2n \cdot \sin\theta_1$, where $r_o$ is the smallest inner radius of said outside coupling portion, $r_1$ is the largest outer radius of said outside coupling portion, $\theta_1$ and $\theta$ are incident angles of said waveguide light beam to said light-coupling medium at radius $(r_o + r_1)/2$ and at radius r respectively, $\Lambda$ is the pitch of the periodic structure of said light-coupling medium, N is the equivalent refractive index of said waveguide layer at radius r, n is the refractive index of said transparent substrate, and $\lambda$ is a wavelength of light emitted by said laser light source.

9. The wavelength locking device according to claim 8, wherein said outside coupling portion has a thickness less than a thickness of said inside coupling portion.

10. A wavelength locking device comprising:

a laser light source having an anti-reflection coating on an output surface;

a transparent substrate disposed so as to cross an optical axis of a laser beam radiated from said laser light source perpendicularly;

a waveguide layer formed on said transparent substrate;

a first light-coupling medium formed on or under said waveguide layer and having a first concentric circular periodic structure whose center is said optical axis; and a second light-coupling medium having a second concentric circular periodic structure whose center is said optical axis, said second concentric circular periodic structure being disposed in the region around said first light-coupling medium on or under said waveguide layer, wherein said laser beam excites a first waveguide light beam moving from the center to the periphery of the first periodic structure, said first waveguide light beam is radiated by said second light-coupling medium, is focused on a reflecting surface, and is reflected by said reflecting surface so as to interact with said second light-coupling medium and become a second waveguide light beam moving from the periphery to the center of the first periodic structure; said second waveguide light beam is radiated from said first light-coupling medium and fed back to said laser light source so as to lock a wavelength of said laser beam.

11. The waveguide locking device according to claim 10, wherein the pitches of the periodic structures of said first and second light-coupling media, $\Lambda_o$ and $\Lambda_1$ respectively, fulfill the requirement presented by the following formulas, $$\Lambda_o = \lambda/(N_o - n \cdot \sin\theta_o),$$

$$\Lambda_1 = \lambda/(N_o + \sin\theta_1)$$

where $N_o$ is the equivalent refractive index of said waveguide layer, $\theta_o$ is the incident angle of said laser beam to said first light-coupling medium, $\theta_1$ is the outgoing angle of light radiated from said second light-coupling medium, n is the refractive index of said transparent substrate, and $\lambda$ is a wavelength of light emitted by said laser light source.

12. The waveguide locking device according to claim 10, wherein an offset structure is formed on said transparent substrate between said first and second light-coupling media, by which said waveguide layer is bent and formed with an offset part, and the waveguide mode is changed by said offset part when said waveguide light beam passes through said offset part.

13. The waveguide locking device according to claim 12, wherein pitches of said first and second light-coupling media, $\Lambda_o$ and $\Lambda_1$ respectively, fulfill the requirement presented by the following formulas, $$\Lambda_o = \lambda/(N_o - n \cdot \sin\theta_o),$$

$$\Lambda_1 = \lambda/(N_1 + \sin\theta_1)$$

where $N_o$ is the equivalent refractive index to said waveguide light beam before passing into said offset part, $N_1$ is the equivalent refractive index for said waveguide light beam after passing into said offset part, $\theta_o$ is the incident angle of said laser beam to said first light-coupling medium, $\theta_1$ is the outgoing angle of light radiated from said second light-coupling medium, n is the refractive index of said transparent substrate, and $\lambda$ is a wavelength of light emitted by said laser light source.

14. A beam collimating device comprising:

a laser light source having an anti-reflection coating on an output surface;

a transparent substrate disposed so as to cross an optical axis of a laser beam radiated from said laser light source perpendicularly;

a waveguide layer formed on said transparent substrate;

a first light-coupling medium formed on or under said waveguide layer having a first concentric circular periodic structure whose center is on said optical axis;

a second light-coupling medium having a second concentric circular periodic structure whose center is on said optical axis in a region around said first light-coupling medium on or under said waveguide layer; and a reflecting surface disposed at a focusing point:

wherein said light beam excites a first waveguide light beam moving from the center to a periphery of the first periodic structure, said first waveguide light beam is radiated by said second light-coupling medium, is focused on the focusing point, is reflected by said reflecting surface disposed at said focusing point and becomes a second waveguide light beam moving from the periphery to the center of the second periodic structure said second waveguide light beam interacts with said first light-coupling medium to radiate a feedback beam and said feedback beam is fed back to said laser light source so as to lock a wavelength of said laser beam.

15. The beam collimating device according to claim 14, wherein pitches of the periodic structures of said first and second light-coupling media are $\Lambda_0$ and $\Lambda_1$, respectively, and fulfill the requirement presented by the following formulas, $$\Lambda_o = \lambda/N_0 - n \cdot \sin\theta_0),$$

$$\Lambda_1 = \lambda/([N_1]N_0 + \sin\theta_1)$$

where $N_0$ is the equivalent refractive index of said waveguide layer, $\theta_0$ is the incident angle of said laser beam to said first light coupling medium, $\theta_1$ is the outgoing angle of light radiated from said second light-coupling medium, n is the refractive index of said transparent substrate, and $\lambda$ is a wavelength of light emitted by said laser light source.

16. The beam collimating device according to claim 14 or 15, wherein an offset structure is formed on said transparent substrate between said first and second light-coupling media, by which said waveguide layer is bent and formed with an offset part, and the waveguide mode is changed by said offset part as said waveguide light beam passes through said offset part.

17. The beam collimating device according to claim 16, wherein the pitches $\Lambda_o$ and $\Lambda_1$ respectively of said first and second light-coupling media fulfill the requirement presented by the following formula, $$\Lambda_o = \lambda/(N_o - n \cdot \sin\theta_o),$$

$$\Lambda_1 = \lambda/(N_1 + \sin\theta_1)$$

where $N_o$ is the equivalent refractive index to said waveguide light beam before passing into said offset part, $N_1$ is the equivalent refractive index for said waveguide light beam after passing into said offset part, $\theta_o$ is the incident angle of said laser beam to said first light-coupling medium, $\theta_1$ is the outgoing angle of light radiated from said second light-coupling medium, n is the refractive index of said transparent substrate, and $\lambda$ is a wavelength of light emitted by said laser light source.

18. An optical disk apparatus for reading an optical disk comprising:

a laser light source;

a transparent substrate disposed so as to cross an optical axis of a laser beam radiated from said laser light source perpendicularly;

a waveguide layer formed on said transparent substrate;

a first light-coupling medium formed on or under said waveguide layer and having a first concentric circular periodic structure whose center is on said optical axis; and a second light-coupling medium having a second concentric circular periodic structure whose center is said optical axis and disposed around said first light-coupling medium on or under said waveguide layer;

wherein an offset structure is formed on said transparent substrate between said first and second light-coupling media, said waveguide layer is bent and formed with an offset waveguide layer portion due to said offset part, said laser beam interacts with said first light-coupling medium and excites a first waveguide light beam moving from the center to the periphery of the first periodic structure said first waveguide light beam is radiated by said second light-coupling medium, focused on a reflecting surface of the optical disk and is reflected to said second light-coupling medium so as to become a second waveguide light beam moving from the periphery to the center of the second periodic structure, said first and second waveguide light beams pass through said offset part and are converted to waveguide light beams having different waveguide modes, a part of said second waveguide light beam is radiated by said first light-coupling medium at a first radiated angle and fed back to said laser light source so as to lock a wavelength of said laser beam, another part of the second waveguide light beam having a different waveguide mode is partially radiated from said first light-coupling medium at an angle different from said first radiated angle and is detected by an optical detector, so as to produce detected signals according to signals reflected by said reflecting surface.

19. The optical disk apparatus according to claim 18, further comprising a third light-coupling medium formed in at least two hollow sector regions adjacent to the outside portion of said second light-coupling medium and having a third concentric circular periodic structure with said optical axis at the center;

wherein said first waveguide light beam moving outward from the center of said first light-coupling medium is partially radiated from said third light-coupling medium and is focused respectively in front of and behind the optical disk by said third light coupling medium, light beams radiated from said third light-coupling medium reflected by said reflecting surface excite a third waveguide light beam moving from the periphery to the center of the third periodic structure, said third waveguide light beam changes waveguide mode by passing through said offset part and is radiated by said first light-coupling medium at an angle different from said first radiated angle, the third radiant beam is detected by focusing optical detectors disposed in a direction to correspond to the third light-coupling medium, and focusing error signals of said reflecting surface are obtained by using difference signals produced by said focusing optical detectors.

20. The optical disk apparatus according to claim 18 or 19, wherein pit marks or dot marks are formed on said reflecting surface;

the quantity of light fed back to said laser light source changes due to said pit marks or dot marks;

the quantity of oscillation light of said laser light source changes because of the change; and marks on said reflecting surface are read according to the change of said oscillation light quantity.

* * * * *